United States Patent

Yamashita

(10) Patent No.: US 9,431,995 B2
(45) Date of Patent: *Aug. 30, 2016

(54) RESONATOR ELEMENT, RESONATOR, RESONATOR DEVICE, OSCILLATOR, ELECTRONIC DEVICE, AND MOBILE OBJECT

(71) Applicant: Seiko Epson Corporation, Tokyo (JP)

(72) Inventor: Go Yamashita, Ina (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/813,528

(22) Filed: Jul. 30, 2015

(65) Prior Publication Data

US 2016/0036413 A1 Feb. 4, 2016

(30) Foreign Application Priority Data

Jul. 31, 2014 (JP) .................................. 2014-157159

(51) Int. Cl.
*H03H 9/19* (2006.01)
*H03B 5/32* (2006.01)
(Continued)

(52) U.S. Cl.
CPC ................. *H03H 9/19* (2013.01); *H03B 5/32* (2013.01); *H03H 9/02023* (2013.01); *H03H 9/02102* (2013.01); *H03H 9/02157* (2013.01); *H03H 9/0552* (2013.01); *H03H 9/1014* (2013.01); *H03H 9/08* (2013.01)

(58) Field of Classification Search
CPC ............................ H03H 9/19; H03H 9/02023
USPC .................................. 331/68, 158, 117 R, 154
See application file for complete search history.

(56) References Cited

U.S. PATENT DOCUMENTS 6,191,524 B1 2/2001 Sasaki et al.
6,518,688 B1 2/2003 Sasaki
(Continued)

FOREIGN PATENT DOCUMENTS

EP 1780890 A2 5/2007
JP 58-047316 A 3/1983
(Continued)

OTHER PUBLICATIONS

Goka, Shigeyoshi, "A Study on Improvement of Properties of AT-Cut Quartz Resonator Having Mesa Structure", Tokyo Metropolitan University, Mar. 2005, pp. 1-120 (with English translation).

(Continued)

*Primary Examiner* — Jeffrey Shin
(74) *Attorney, Agent, or Firm* — Harness, Dickey & Pierce, P.L.C.

(57) ABSTRACT

A resonator element includes a quartz crystal substrate having a main surface along a plane including an X-axis and a Z'-axis, and a thickness in a Y'-axis direction. The quartz crystal substrate includes a vibrating portion including a side along the X-axis, a side along the Z'-axis, and a peripheral portion having a thickness smaller than that of the vibrating portion, which is provided along an outer edge of the vibrating portion. The vibrating portion includes a first portion and a second portion having a thickness smaller than that of the first portion, which is provided on at least an outer edge on a +X side of the X-axis and an outer edge on a −X side thereof, among outer edges of the first portion. When Z is a length of the quartz crystal substrate along the Z'-axis, and t is a thickness of the first portion, $11 < Z/t \leq 53$.

16 Claims, 23 Drawing Sheets

(51) Int. Cl.
*H03H 9/02* (2006.01)
*H03H 9/05* (2006.01)
*H03H 9/10* (2006.01)
*H03H 9/08* (2006.01)

(56) References Cited

U.S. PATENT DOCUMENTS

| | | | |
|---|---|---|---|
| 7,388,454 B2 | 6/2008 | Ruby et al. | |
| 7,518,294 B2 | 4/2009 | Umetsu | |
| 7,535,154 B2 | 5/2009 | Umeda et al. | |
| 8,450,906 B2 | 5/2013 | Taniguchi et al. | |
| 8,536,761 B2 | 9/2013 | Yamashita et al. | |
| 8,614,607 B2 * | 12/2013 | Il .......................... | H03H 9/177 331/158 |
| 8,638,022 B2 | 1/2014 | Yamashita et al. | |
| 8,766,514 B2 * | 7/2014 | Il .......................... | H03H 3/02 310/320 |
| 9,030,078 B2 * | 5/2015 | Il .......................... | H03H 3/02 310/333 |
| 2003/0111935 A1 | 6/2003 | Akane et al. | |
| 2004/0095044 A1 | 5/2004 | Yagishita | |
| 2005/0258146 A1 | 11/2005 | Umetsu | |
| 2007/0008829 A1 | 1/2007 | Kitahara et al. | |
| 2007/0096596 A1 | 5/2007 | Naito et al. | |
| 2010/0148637 A1 | 6/2010 | Satou | |
| 2010/0277251 A1 | 11/2010 | Kondo | |
| 2011/0203083 A1 | 8/2011 | Sasaki et al. | |
| 2012/0056514 A1 | 3/2012 | Ishikawa et al. | |
| 2012/0126668 A1 * | 5/2012 | Il .......................... | H03H 3/02 310/357 |
| 2012/0235762 A1 * | 9/2012 | Il .......................... | H03H 9/177 331/158 |
| 2013/0032842 A1 | 2/2013 | Park et al. | |
| 2013/0063002 A1 | 3/2013 | Mizusawa et al. | |
| 2013/0106247 A1 | 5/2013 | Ariji et al. | |
| 2013/0106249 A1 | 5/2013 | Ariji et al. | |
| 2013/0193807 A1 | 8/2013 | Mizusawa | |
| 2013/0249353 A1 | 9/2013 | Naito et al. | |
| 2013/0328452 A1 | 12/2013 | Fujihara et al. | |
| 2014/0139074 A1 | 5/2014 | Naito et al. | |

FOREIGN PATENT DOCUMENTS

| | | |
|---|---|---|
| JP | 58-045205 B2 | 10/1983 |
| JP | 02-057009 A | 2/1990 |
| JP | 06-052230 U | 7/1994 |
| JP | 10-308645 A | 11/1998 |
| JP | 11-355094 A | 12/1999 |
| JP | 2001-077647 A | 3/2001 |
| JP | 2001-230654 A | 8/2001 |
| JP | 2001-230655 A | 8/2001 |
| JP | 2004-200777 A | 7/2004 |
| JP | 2005-159717 A | 6/2005 |
| JP | 2005-318477 A | 11/2005 |
| JP | 3731348 B2 | 1/2006 |
| JP | 2006-108949 A | 4/2006 |
| JP | 2007-189492 A | 7/2007 |
| JP | 4075893 B2 | 4/2008 |
| JP | 2008-236439 A | 10/2008 |
| JP | 2008-263387 A | 10/2008 |
| JP | 2008-306594 A | 12/2008 |
| JP | 2009-065270 A | 3/2009 |
| JP | 2009-130543 A | 6/2009 |
| JP | 2009-130564 A | 6/2009 |
| JP | 4341583 B2 | 10/2009 |
| JP | 4341671 B2 | 10/2009 |
| JP | 2010-062723 A | 3/2010 |
| JP | 2010-109527 A | 5/2010 |
| JP | 2010-114620 A | 5/2010 |
| JP | 4506135 B2 | 7/2010 |
| JP | 4558433 B2 | 10/2010 |
| JP | 4572807 B2 | 11/2010 |
| JP | 2012-054796 A | 3/2012 |
| JP | 2012-114495 A | 6/2012 |
| JP | 2012-114496 A | 6/2012 |
| JP | 2012-199602 A | 10/2012 |
| JP | 2013-098813 A | 5/2013 |
| JP | 2013-098814 A | 5/2013 |
| JP | 2013-141311 A | 7/2013 |
| JP | 2013-192044 A | 9/2013 |
| JP | 2013-197913 A | 9/2013 |
| JP | 2014-147091 A | 8/2014 |
| JP | 2014-180050 A | 9/2014 |

OTHER PUBLICATIONS

Goka et al.: "Mode Decoupling Effect of Multistepped Bi-Mesa AT-Cut Quatz"; Japanese Journal of Applied Physics; vol. 43; No. 5B; pp. 3016-3019; May 28, 2004.

Extended European Search Report for Application No. 11 18 9519 mailed on Mar. 30, 2012 (9 pages).

Goka, S. et al, "Decoupling Effect of Stepped Mesa Structures on Spurious Vibrations of At-Cut Quartz Plates", Frequency Control Symposium and Exhibition, 2000. Proceedings of the 2000 IEEE/EIA International, Jun. 7-9, 2000, Piscataway, NJ, IEEE, Jan. 1, 2000, pp. 397-400.

Shen, F. et al., "Energy Trapping in Mesa-Shaped Quartz Crystal Microbalance", Proceedings of IEEE Sensors 2002, Orlando, FL, Jun. 12-14, 2002, IEEE International Conference on Sensors, New York, NY, IEEE, U.S., vol. 2, Jun. 12, 2002, pp. 1154-1159.

* cited by examiner

| FREQUENCY [MHz] | Mz [mm] | X [mm] | Z [mm] | X/t | Z/t | Ez [mm] | CI [Ω] |
|---|---|---|---|---|---|---|---|
| 24.0 | 0.43 | 1.1 | 0.63 | 15.81 | 9.05 | 0.53 | 58 |
| 24.0 | 0.80 | 1.4 | 1.04 | 20.12 | 14.95 | 0.76 | 28 |
| 32.0 | 0.47 | 1.1 | 0.65 | 21.08 | 12.46 | 0.53 | 45 |
| 32.0 | 0.80 | 1.4 | 1.02 | 26.83 | 19.54 | 0.76 | 17 |
| 38.4 | 0.32 | 1.1 | 0.48 | 25.29 | 11.04 | 0.37 | 45 |
| 38.4 | 0.49 | 1.1 | 0.62 | 25.29 | 14.26 | 0.53 | 30 |
| 38.4 | 0.80 | 1.4 | 1.00 | 32.19 | 22.99 | 0.76 | 13 |
| 48.0 | 0.45 | 1.1 | 0.62 | 31.62 | 17.82 | 0.49 | 30 |
| 48.0 | 0.64 | 1.4 | 0.98 | 40.24 | 28.17 | 0.76 | 14 |
| 80.0 | 0.45 | 1.1 | 0.62 | 52.69 | 29.70 | 0.50 | 19 |
| 80.0 | 0.60 | 1.4 | 1.10 | 67.07 | 52.69 | 0.76 | 11 |

RESONATOR ELEMENT, RESONATOR, RESONATOR DEVICE, OSCILLATOR, ELECTRONIC DEVICE, AND MOBILE OBJECT

BACKGROUND

1. Technical Field

The present invention relates to a resonator element, a resonator, a resonator device, an oscillator, an electronic device, and a mobile object.

2. Related Art

Resonator elements using a quartz crystal are known. Such resonator elements have excellent frequency-temperature characteristics, and thus are widely used as reference frequency sources, oscillation sources and the like of various electronic devices. Particularly, resonator elements using a quartz crystal substrate which is cut out at a cut angle called an AT cut exhibit frequency-temperature characteristics having a cubic curve, and thus are also widely used in mobile object communication devices such as cellular phones, and the like.

For example, JP-A-2012-114496 discloses that, in an AT cut quartz crystal resonator element having a multistage-type mesa structure, a vibrating portion which is a mesa portion includes a first portion and a second portion having a thickness smaller than that of the first portion, which is integrally formed in the vicinity of the first portion when seen in a plan view, and when the dimension of an AT cut substrate in a direction along a Z'-axis is set to Z, the dimension of the vibrating portion in a direction along the Z'-axis is set to Mz, and the thickness of the first portion of the vibrating portion is set to t, relations of $8 \leq Z/t \leq 11$ and $0.6 \leq Mz/Z \leq 0.8$ are satisfied, thereby allowing an equivalent series resistance, or a so-called CI (Crystal Impedance) value to be reduced.

In addition, JP-A-2012-114495 discloses that in an AT cut quartz crystal resonator element having a multistage-type mesa structure in which respective lateral sides of a first portion and a second portion constituting a mesa-shaped vibrating portion which extend in a direction along an X-axis are located within one surface, relations of $8 \leq Z/t \leq 11$ and $0.6 \leq Mz/Z \leq 0.8$ are satisfied, thereby allowing the value of an equivalent series resistance to be reduced.

However, in the resonator elements disclosed in JP-A-2012-114496 and JP-A-2012-114495, the equivalent series resistance may be set to 58Ω, for example, when a frequency is 24 MHz, and thus a further reduction in equivalent series resistance is desired.

SUMMARY

An advantage of some aspects of the invention is to provide a resonator element capable of achieving a reduction in equivalent series resistance. Another advantage of the invention is to provide a resonator, a resonator device, an oscillator, an electronic device, and a mobile object which include the resonator element.

The invention can be implemented as the following forms or application examples.

Application Example 1

A resonator element according to this application example includes a quartz crystal substrate in which, using an X-axis of an orthogonal coordinate system, constituted by the X-axis as an electrical axis, a Y-axis as a mechanical axis, and a Z-axis as an optical axis which are crystal axes of a quartz crystal, as an axis of rotation, an axis obtained by inclining the Z-axis so that a +Z side rotates in a −Y direction of the Y-axis is set to a Z'-axis, an axis obtained by inclining the Y-axis so that a +Y side rotates in a +Z direction of the Z-axis is set to a Y'-axis, a plane including the X-axis and the Z'-axis is set to a main surface, and a direction along the Y'-axis is set to a thickness. The quartz crystal substrate includes a vibrating portion including a side along the X-axis and a side along the Z'-axis, and a peripheral portion, having a thickness smaller than that of the vibrating portion, which is provided along an outer edge of the vibrating portion. The vibrating portion includes a first portion, and a second portion, having a thickness smaller than that of the first portion, which is provided on at least an outer edge on a +X side of the X-axis and an outer edge on a −X side thereof, among outer edges of the first portion. When a length of the quartz crystal substrate along the Z'-axis is set to Z, and a thickness of the first portion is set to t, a relation of $11 < Z/t \leq 53$ is satisfied.

In such a resonator element, it is possible to achieve a reduction in equivalent series resistance (the detailed description thereof will be given later).

Application Example 2

In the resonator element according to the application example, a relation of $13 \leq Z/t \leq 4$ may be satisfied.

In such a resonator element, it is possible to achieve a further reduction in equivalent series resistance.

Application Example 3 and Application Example 4

In the resonator element according to the application example, the vibrating portion may include a convex portion protruding in a +Y' direction of the Y'-axis further upward than the peripheral portion. The convex portion may include one lateral side including a surface which intersects the Z'-axis and is inclined with respect to a plane including the X-axis and the Z'-axis, the other lateral side including a surface which intersects the Z'-axis and is perpendicular to the plane including the X-axis and the Z'-axis, and a flat portion which is interposed between the one lateral side and the other lateral side. When a length of the flat portion along the Z'-axis is set to Mz, a relation of $0.45$ mm $< Mz \leq 0.8$ mm may be satisfied.

In such a resonator element, it is possible to more reliably achieve a reduction in equivalent series resistance.

Application Example 5

In the resonator element according to the application example, a relation of $0.49$ mm $< Mz < 0.8$ mm may be satisfied.

In such a resonator element, it is possible to achieve a further reduction in equivalent series resistance while achieving a reduction in the size of the vibrating portion.

Application Example 6, Application Example 7, and Application Example 8

In the resonator element according to the application example, the vibrating portion may include a convex portion protruding in a +Y' direction of the Y'-axis further upward than the peripheral portion. The convex portion may include one lateral side including a surface which intersects the Z'-axis and is inclined with respect to a plane including the X-axis and the Z'-axis, the other lateral side including a surface which intersects the Z'-axis and is perpendicular to the plane including the X-axis and the Z'-axis, and a flat portion which is interposed between the one lateral side and the other lateral side. When seen in a plan view, a length of the one lateral side along the Z'-axis is set to Sz, and a length of the flat portion along the Z'-axis is set to Mz, a relation of $0 \leq Sz/Mz \leq 0.05$ may be satisfied.

In such a resonator element, it is possible to reduce an unnecessary mode.

Application Example 9, Application Example 10, and Application Example 11

In the resonator element according to the application example, the vibrating portion may include a convex portion protruding in a +Y' direction of the Y'-axis further upward than the peripheral portion. The convex portion may include one lateral side including a surface which intersects the Z'-axis and is inclined with respect to a plane including the X-axis and the Z'-axis, the other lateral side including a surface which intersects the Z'-axis and is perpendicular to the plane including the X-axis and the Z'-axis, and a flat portion which is interposed between the one lateral side and the other lateral side. When a length of the flat portion along the Z'-axis is set to Mz, a relation of $40\ \mu m \leq (Z-Mz)/2 \leq 400\ \mu m$ may be satisfied.

In such a resonator element, it is possible to reduce the transmission (vibration leakage) of the vibration of the vibrating portion to the peripheral portion.

Application Example 12

In the resonator element according to the application example, a first main surface and a second main surface of the quartz crystal substrate which have a front-back relationship with each other may include excitation electrodes which are provided so as to overlap each other when seen in a plan view. When seen in a plan view, the vibrating portion may be provided inside outer edges of the excitation electrodes.

In such a resonator element, when seen in a plan view from the Y'-axis direction, it is possible to apply a voltage to a wide portion of the vibrating portion.

Application Example 13

A resonator according to this application example includes the resonator element according to the application example, and a package in which the resonator element is stored.

Since such a resonator includes the resonator element according to the application example, it is possible to achieve a reduction in equivalent series resistance.

Application Example 14

A resonator device according to this application example includes the resonator element according to the application example, and an electronic element.

Since such a resonator device includes the resonator element according to the application example, it is possible to achieve a reduction in equivalent series resistance.

Application Example 15

In the resonator device according to the application example, the electronic element may be a thermo-sensitive element.

Since such a resonator device includes the resonator element according to the application example, it is possible to achieve a reduction in equivalent series resistance.

Application Example 16

An oscillator according to this application example includes the resonator element according to the application example, and an oscillation circuit which is electrically connected to the resonator element.

Since such an oscillator includes the resonator element according to the application example, it is possible to achieve a reduction in power consumption.

Application Example 17

An electronic device according to this application example includes the resonator element according to the application example.

Since such an electronic device includes the resonator element according to the application example, it is possible to include a resonator element capable of achieving a reduction in power consumption.

Application Example 18

A mobile object according to this application example includes the resonator element according to the application example.

Since such a mobile object includes the resonator element according to the application example, it is possible to include a resonator element capable of achieving a reduction in power consumption.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference the accompanying drawings. The embodiments described below do not unduly limit the scope of the invention described in the appended claims. In addition, all the elements described below are not necessarily essential components of the invention.

1. Resonator Element

Figure 1:
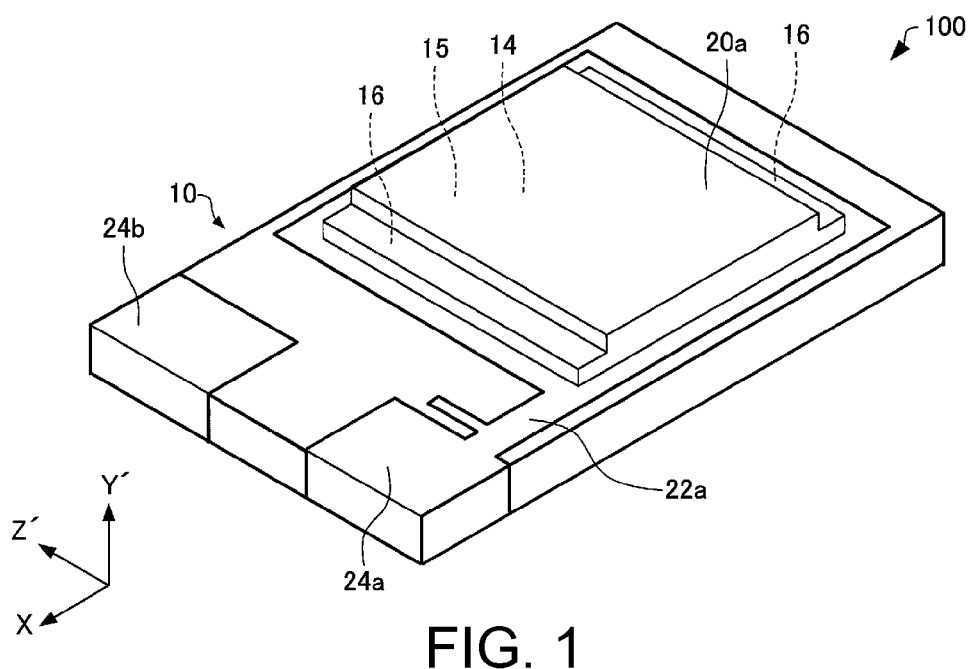
FIG. 1 is a perspective view schematically illustrating a resonator element according to the present embodiment.
Figure 2:
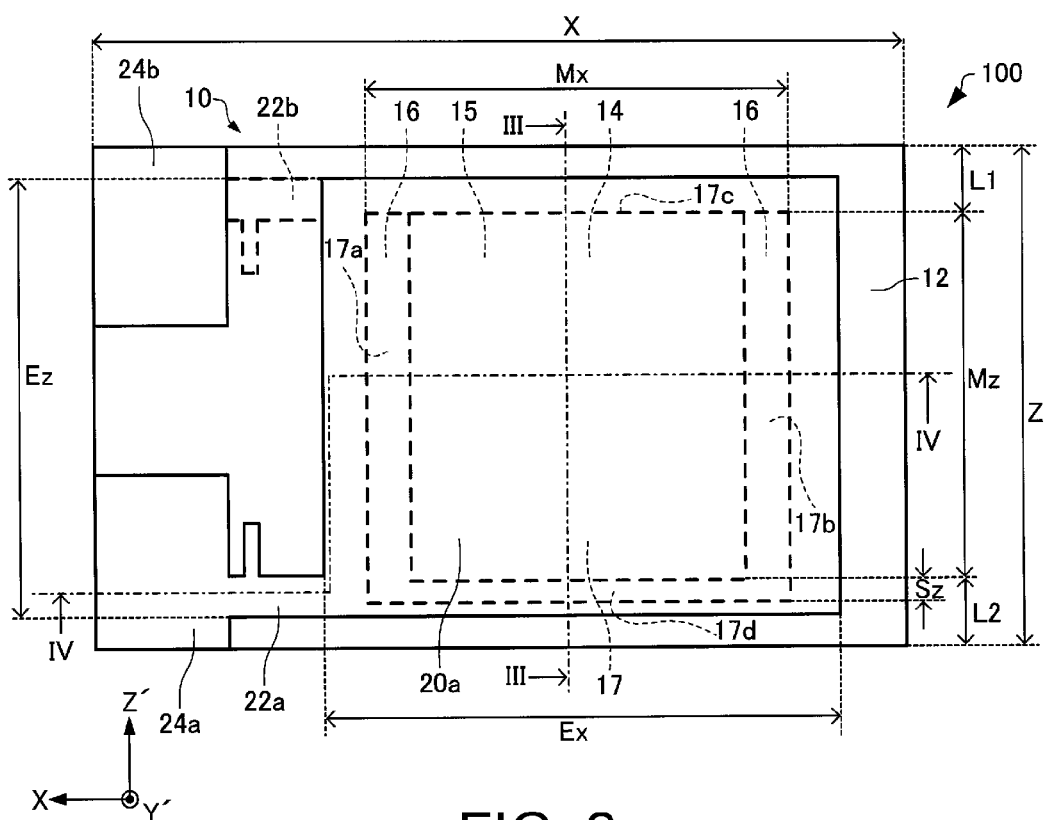
FIG. 2 is a plan view schematically illustrating the resonator element according to the present embodiment.
Figure 3:
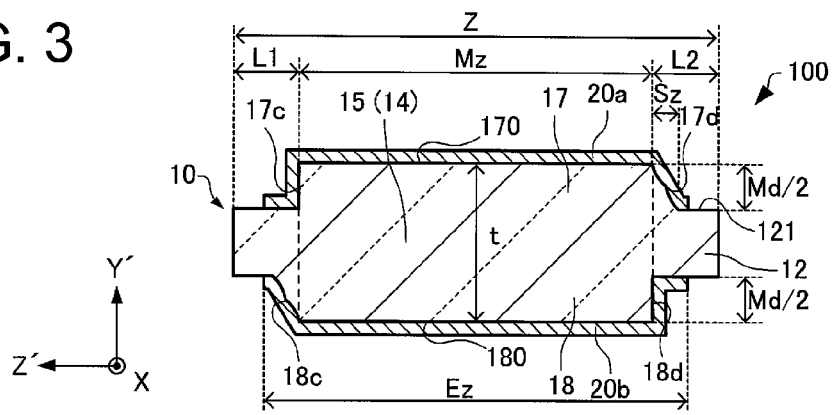
FIG. 3 is a cross-sectional view schematically illustrating the resonator element according to the present embodiment.
Figure 4:
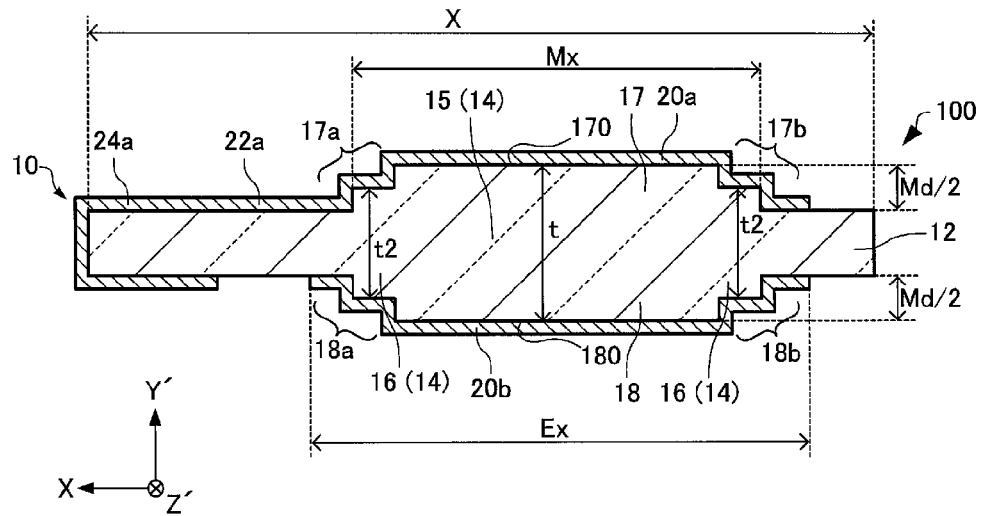
FIG. 4 is a cross-sectional view schematically illustrating the resonator element according to the present embodiment.

First, a resonator element according to the present embodiment will be described with reference to the accompanying drawings. FIG. 1 is a perspective view schematically illustrating a resonator element 100 according to the present embodiment. FIG. 2 is a plan view schematically illustrating the resonator element 100 according to the present embodiment. FIG. 3 is a cross-sectional view taken along line III-III of FIG. 2 which schematically illustrates the resonator element 100 according to the present embodiment. FIG. 4 is a cross-sectional view taken along line IV-IV of FIG. 2 which schematically illustrates the resonator element 100 according to the present embodiment.

As shown in FIGS. 1 to 4, the resonator element 100 includes a quartz crystal substrate 10 and excitation electrodes 20a and 20b.

The quartz crystal substrate 10 is formed of an AT cut quartz crystal substrate. Here, FIG. 5 is a perspective view schematically illustrating an AT cut quartz crystal substrate 101.

Figure 5:
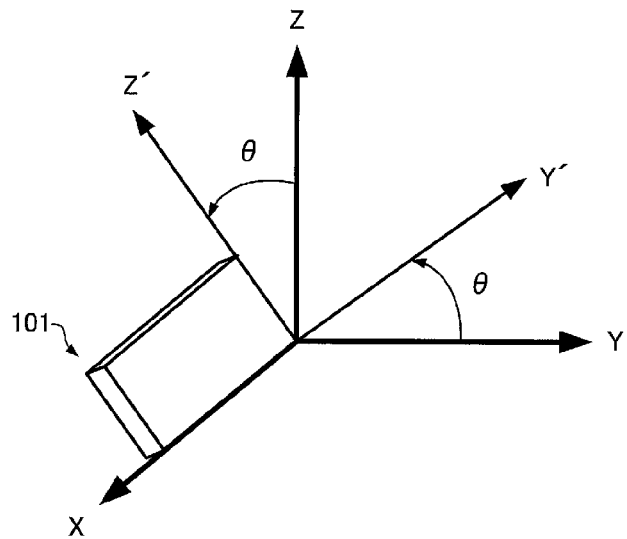
FIG. 5 is a perspective view schematically illustrating an AT cut quartz crystal substrate.

A piezoelectric material such as quartz crystal generally has a trigonal system, and has crystal axes (X, Y, Z) as shown in FIG. 5. The X-axis is an electrical axis, the Y-axis is a mechanical axis, and the Z-axis is an optical axis. The quartz crystal substrate 101 is a flat plate of a so-called rotation Y cut quartz crystal substrate which is cut out from a piezoelectric material (for example, synthetic quartz crystal) along a plane obtained by rotating an XZ plane (plane including the X-axis and the Z-axis) by an angle θ around the X-axis. The Y-axis and the Z-axis are also rotated by θ around the X-axis, and are set to a Y'-axis and a Z'-axis, respectively. The quartz crystal substrate 101 is a substrate in which a plane including the X-axis and the Z'-axis is set to a main surface, and a direction along the Y'-axis is set to a thickness. Here, when θ=35° 15', the quartz crystal substrate 101 becomes an AT cut quartz crystal substrate. Therefore, the AT cut quartz crystal substrate 101 is configured such that an XZ' plane (plane including the X-axis and the Z'-axis) orthogonal to the Y'-axis is set to a main surface (main surface of a vibrating portion), and can vibrate using a thickness sliding vibration as a main vibration. It is possible to obtain the quartz crystal substrate 10 by processing the AT cut quartz crystal substrate 101.

As shown in FIG. 5, the quartz crystal substrate 10 is formed of an AT cut quartz crystal substrate in which, using the X-axis of an orthogonal coordinate system, constituted by the X-axis as an electrical axis, the Y-axis as a mechanical axis, and the Z-axis as an optical axis which are crystal axes of a quartz crystal, as the axis of rotation, an axis obtained by inclining the Z-axis so that the +Z side rotates in the −Y direction of the Y-axis is set to a Z'-axis, an axis obtained by inclining the Y-axis so that the +Y side rotates in the +Z direction of the Z-axis is set to a Y'-axis, a plane including the X-axis and the Z'-axis is set to a main surface, and a direction along the Y'-axis is set to a thickness. FIGS. 1 to 4 and FIGS. 6 to 20 shown below show the X-axis, the Y'-axis, and the Z'-axis which are at right angles to one another.

As shown in FIG. 2, for example, the quartz crystal substrate 10 has a rectangular shape in which a direction along the Y'-axis (hereinafter, also referred to as the "Y'-axis direction") is set to a thickness direction, and when seen in a plan view from the Y'-axis direction, a direction along the X-axis (hereinafter, also referred to as the "X-axis direction") is set to a long side, and a direction along the Z'-axis (hereinafter, also referred to as the "Z'-axis direction") is set to a short side. The quartz crystal substrate 10 includes a peripheral portion 12 and a vibrating portion 14.

As shown in FIG. 2, the peripheral portion 12 is provided in the vicinity of the vibrating portion 14. The peripheral portion 12 is provided along the outer edge of the vibrating portion 14. The peripheral portion 12 has a thickness smaller than that of the vibrating portion 14 (is smaller in thickness than the vibrating portion 14).

As shown in FIG. 2, when seen in a plan view from the Y'-axis direction, the vibrating portion 14 is surrounded by the peripheral portion 12, and has a thickness larger than that of the peripheral portion 12. The vibrating portion 14 includes a side along the X-axis and a side along the Z'-axis. Specifically, the vibrating portion 14 has a rectangular shape in which the X-axis direction is set to a long side and the Z'-axis direction is set to a short side, when seen in a plan view from the Y'-axis direction. When seen in a plan view from the Y'-axis direction, the center of the quartz crystal substrate 10 and the center of the vibrating portion 14 do not overlap each other. When seen in a plan view from the Y'-axis direction, a distance between the center of the quartz crystal substrate 10 and the center of the vibrating portion 14 is, for example, approximately 0.1 mm. The vibrating portion 14 includes a first portion 15 and second portions 16.

The first portion 15 has a thickness larger than that of each of the second portions 16. In the example shown in FIGS. 3 and 4, the first portion 15 is a portion having a thickness t. The first portion 15 has a quadrangular shape when seen in a plan view from the Y'-axis direction.

The second portion 16 has a thickness smaller than that of the first portion. In the shown example, the second portion 16 is a portion having a thickness t2. The second portions 16 are provided in the +X direction of the X-axis (hereinafter, also simply referred to as the "+X direction") of the first portion 15 and in the −X direction of the X-axis (hereinafter, also simply referred to as the "−X direction"). That is, the first portion 15 is interposed between the second portions 16 in the X-axis direction. The second portions 16 are provided on the outer edge on the +X side of the X-axis and the outer edge on the −X side thereof, among the outer edges of the first portion 15. As described above, the vibrating portion 14 includes two types of portions 15 and 16 having different thicknesses, and it can be said that the resonator element 100 has a two-step type of mesa structure.

The vibrating portion 14 can vibrate using a thickness-shear vibration as a main vibration. The vibrating portion 14 has a two-step type of mesa structure, and thus the resonator element 100 has an energy confinement effect.

As shown in FIGS. 3 and 4, the vibrating portion 14 includes a first convex portion 17 protruding in the +Y' direction of the Y'-axis (hereinafter, also simply referred to as the "+Y' direction") further upward than the peripheral portion 12, and a second convex portion 18 protruding in the −Y' direction of the Y'-axis (hereinafter, also simply referred to as the "−Y' direction") further downward than the peripheral portion 12. For example, the shapes of the convex portions 17 and 18 are the same as each other, and the sizes of the convex portions 17 and 18 are the same as each other.

The first convex portion 17 includes a first planar surface 170 which is formed by the first portion 15. The second convex portion 18 includes a second planar surface 180 which is formed by the first portion 15. In the shown example, the planar surfaces 170 and 180 are along the planes including the X-axis and the Z'-axis.

For example, as shown in FIG. 4, a lateral side 17a of the first convex portion 17 in the +X direction and a lateral side 17b thereof in the −X direction are provided with two stepped differences due to a difference between the thickness of the first portion 15 and the thickness of the second portion 16 or a difference between the thickness of the second portion 16 and the thickness of the peripheral portion 12. A lateral side 18a of the second convex portion 18 in the +X direction and a lateral side 18b thereof in the −X direction are provided with two stepped differences due to, for example, a difference between the thickness of the first portion 15 and the thickness of the second portion 16 or a difference between the thickness of the second portion 16 and the thickness of the peripheral portion 12. In the shown example, the lateral sides 17a, 17b, 18a, and 18b are constituted by a first lateral side and a second lateral side which are along planes including the Y'-axis and the Z'-axis, and sides along planes including the X-axis and the Z'-axis which are disposed between the first lateral side and the second lateral side. The lateral sides 17a, 17b, 18a, and 18b are sides (for example, sides orthogonal to) intersecting the Z'-axis.

A lateral side 17c of the first convex portion 17 in the +Z' direction of the Z'-axis (hereinafter, also simply referred to as the "+Z' direction") is a side perpendicular to a plane including the X-axis and the Z'-axis, for example, as shown in FIG. 3. In other words, the lateral side 17c is a side perpendicular to the first planar surface 170. A lateral side 17d of the first convex portion 17 in the −Z' direction of the Z'-axis (hereinafter, also simply referred to as the "−Z' direction") is, for example, a side inclined with respect to the plane including the X-axis and the Z'-axis. In other words, the lateral side 17d is a side inclined with respect to the first planar surface 170.

A lateral side 18c of the second convex portion 18 in the +Z' direction is a side inclined with respect to the plane including the X-axis and the Z'-axis, for example, as shown in FIG. 3. In other words, the lateral side 18c is a side inclined with respect to the second planar surface 180. A lateral side 18d of the second convex portion 18 in the −Z' direction is a side perpendicular to the plane including the X-axis and the Z'-axis. In other words, the lateral side 18d is a side perpendicular to the second planar surface 180.

When an AT cut quartz crystal substrate is etched, for example, using a solution including hydrofluoric acid as an etching solution, the lateral side 17d of the first convex portion 17 and the lateral side 18c of the second convex portion 18 are formed as sides inclined with respect to the plane including the X-axis and the Z'-axis by the m-plane of a quartz crystal being exposed. Although not shown, the lateral sides of the quartz crystal substrate 10 in the −Z' direction other than the lateral sides 17d and 18c may also be formed as sides inclined with respect to the plane including the X-axis and the Z'-axis by the m-plane of a quartz crystal being exposed.

Figure 6:
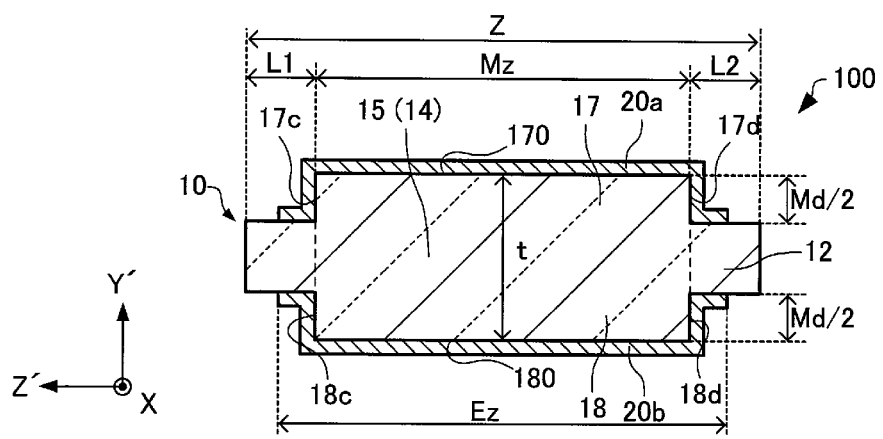
FIG. 6 is a cross-sectional view schematically illustrating the resonator element according to the present embodiment.

In addition, as shown in FIG. 6, the lateral sides 17d and 18c may be sides perpendicular to the plane including the X-axis and the Z'-axis. For example, an AT cut quartz crystal substrate is processed using a laser, or the AT cut quartz crystal substrate is etched using dry etching, thereby allowing the lateral side 17d and the lateral side 18c to be formed as sides perpendicular to the plane including the X-axis and the Z'-axis. For convenience, FIG. 1 shows a case where the lateral sides 17d and 18c are sides perpendicular to the plane including the X-axis and the Z'-axis.

The first excitation electrode 20a and the second excitation electrode 20b are provided in the vibrating region (vibrating portion 14) of the quartz crystal substrate 10 so as to overlap each other when seen in a plan view. The excitation electrodes 20a and 20b are provided in a first main surface and a second main surface (for example, planar surfaces 170 and 180) of the quartz crystal substrate 10 which have a front-back relationship with each other so as to overlap each other when seen in a plan view. In the shown example, the first excitation electrode 20a is provided in the +Y' direction of the quartz crystal substrate 10, and the second excitation electrode 20b is provided in the −Y' direction of the quartz crystal substrate 10. The excitation electrodes 20a and 20b are provided with the vibrating portion 14 interposed therebetween. In the shown example, the excitation electrodes 20a and 20b are rectangular in shape when seen in a plan view (shape when seen from the Y'-axis direction). When seen in a plan view from the Y'-axis direction, the vibrating portion is provided inside the outer edges of the excitation electrodes 20a and 20b. The excitation electrode 20 is an electrode for applying a voltage to the vibrating portion 14.

The first excitation electrode 20a is connected to a first pad 24a through a first extraction electrode 22a. The second excitation electrode 20b is connected to a second pad 24b through a second extraction electrode 22b. The pads 24a and 24b are electrically connected to, for example, an IC chip (not shown) for driving the resonator element 100. The excitation electrodes 20a and 20b, the extraction electrodes 22a and 22b, and the pads 24a and 24b which are to be used have, for example, chromium and gold laminated in this order from the quartz crystal substrate 10 side.

Here, in the resonator element 100, when the dimension of the quartz crystal plate 10 in a direction parallel to the Z'-axis (length along the Z'-axis) is set to Z, and the thickness of the first portion 15 of the vibrating portion 14 is set to t, a relation of the following Expression (1) is satisfied.

$$11 < Z/t \leq 53 \tag{1}$$

Further, it is preferable to satisfy a relation of the following Expression (2).

$$13 \leq Z/t \leq 34 \tag{2}$$

In the resonator element 100, when the dimension of the short side of the vibrating portion 14 (length along the Z'-axis) is set to Mz, it is preferable to satisfy a relation of the following Expression (3).

$$0.45 \text{ mm} < Mz \leq 0.8 \text{ mm} \tag{3}$$

Further, it is preferable to satisfy a relation of the following Expression (4).

$$0.49 \text{ mm} < Mz < 0.8 \text{ mm} \tag{4}$$

The dimension (Mz) of the short side of the vibrating portion 14 is a size of the flat portion of the vibrating portion 14 in the Z'-axis direction, and specifically refers to a size of the first planar surface 170 in the Z'-axis direction, or, a size of the second planar surface 180 in the Z'-axis direction.

In the resonator element 100, as shown in FIG. 2, when the dimension of the lateral sides 17d and 18c in the Z'-axis direction (length along the Z'-axis) is set to Sz when seen in a plan view from the Y'-axis direction, it is preferable to satisfy a relation of the following Expression (5). Here, Sz is a distance in the Z'-axis direction between a boundary line between the planar surface 170 and the lateral side 17d of the first convex portion 17 and a boundary line between a surface 121 and the lateral side 17d of the peripheral portion 12 facing in the +Y' direction, for example, when seen in a plan view from the Y'-axis direction (see FIG. 3).

$$0 \leq Sz/Mz \leq 0.05 \tag{5}$$

In a case of Sz/Mz=0, as shown in FIG. 6, the lateral sides 17d and 18c are perpendicular to the plane including the X-axis and the Z'-axis.

In the resonator element 100, for example, as shown in FIG. 2, a distance L1 between the end of the quartz crystal substrate 10 in the +Z' direction and the end of the first portion 15 of the vibrating portion 14 in the +Z' direction is (Z−Mz)/2. A distance L2 between the end of the quartz crystal substrate 10 in the −Z' direction and the end of the first portion 15 of the vibrating portion 14 in the −Z' direction is (Z−Mz)/2. It is preferable that (Z−Mz)/2 satisfies the following Expression (6).

$$40 \text{ μm} \leq (Z-Mz)/2 \leq 400 \text{ μm} \tag{6}$$

In the resonator element 100, when the dimension of the quartz crystal substrate 10 in the X-axis direction is set to X, it is preferable to satisfy a relation of the following Expression (7).

$$16 \leq X/t \leq 54 \tag{7}$$

Alternatively, it is preferable to satisfy a relation of the following Expression (8).

$$20 \leq X/t \leq 67 \tag{8}$$

In the resonator element 100, the dimension X of the quartz crystal substrate 10 in the X-axis direction is, for example, equal to or greater than 0.7 mm and equal to or less than 1.5 mm. The dimension Z of the quartz crystal substrate 10 in the Z'-axis direction is, for example, equal to or greater than 0.55 mm and equal to or less than 1.1 mm. The dimension Mx of the vibrating portion 14 in the X-axis direction is, for example, equal to or greater than 0.45 mm and equal to or less than 0.9 mm. The dimension Mz of the vibrating portion 14 in the Z'-axis direction is, for example, equal to or greater than 0.3 mm and equal to or less than 0.9 mm. The dimension Sz of the lateral sides 17d and 18c in the Z'-axis direction when seen from the Y'-axis direction is, for example, equal to or greater than 0 mm and equal to or less than 0.015 mm. The thickness Md/2 (see FIGS. 3 and 4) of the convex portions 17 and 18 of the vibrating portion 14 is, for example, equal to or greater than 0.005 mm and equal to or less than 0.015 mm. The dimension Ex of the excitation electrodes 20a and 20b in the X-axis direction is, for example, equal to or greater than 0.3 mm and equal to or less than 1 mm. The dimension Ez of the excitation electrodes 20a and 20b in the Y-axis direction is, for example, equal to or greater than 0.3 mm and equal to or less than 1 mm. The vibration frequency of the resonator element 100 is, for example, equal to or greater than 24 MHz and equal to or less than 80 MHz. When seen in a plan view from the Y'-axis direction, the ratio of the area of the first portion 15 to the sum of the area of the first portion 15 of the vibrating portion 14 and the area of the second portion 16 is, for example, 1.09 to 1.5.

In the above, a description has been given of the resonator element 100 having a two-step type of mesa structure in which the vibrating portion 14 includes two types of portions 15 and 16 having different thicknesses, but the resonator element according to the invention is not particularly limited insofar as the number of steps of a mesa structure (for example, the number of stepped differences of the lateral side 17a) is two or more.

The resonator element 100 has, for example, the following features.

The resonator element 100 includes the first portion 15 and the second portions 16, having a thickness smaller than that of the first portion 15, which are provided on at least the outer edge on the +X side and the outer edge on the −X side among the outer edges of the first portion 15, and satisfies a relation of $11<Z/t \leq 53$ when the length of the quartz crystal substrate 10 along the Z'-axis is set to Z, and the thickness of the first portion 15 is set to t. Therefore, in the resonator element 100, it is possible to achieve a reduction in equivalent series resistance while achieving a reduction in size. Specifically, in the resonator element 100, since the relation of $11<Z/t$ is established, it is possible to reduce, for example, coupling between a thickness-shear vibration and an unnecessary mode such as a contour vibration, and to set an equivalent series resistance (CI value) to be equal to or less than $45\Omega$ (see an experimental example of which the detailed description will be given later).

Further, in the resonator element 100, a vibration frequency is, for example, equal to or greater than 24 MHz and equal to or less than 80 MHz, a relation of $t=21$ μm is established when the frequency is 80 MHz, and the dimension Z of the quartz crystal substrate 10 in the Z'-axis direction becomes maximum. Therefore, in the resonator element 100, since the relation of $Z/t \leq 53$ is established, it is possible to set Z to be equal to or less than 1.1 mm even when the vibration frequency is 80 MHz. In this manner, in the resonator element 100, it is possible to achieve a reduction in size. As a result, it is possible to achieve a reduction in the size of a package that stores the resonator element 100.

In the resonator element 100, the relation of $13 \leq Z/t \leq 34$ is satisfied. Therefore, in the resonator element 100, it is possible to achieve a further reduction in equivalent series resistance while achieving a reduction in size. Specifically, it is possible to set the equivalent series resistance to be equal to or less than $40\Omega$ (see an experimental example of which the detailed description will be given later).

Further, in the resonator element 100, the vibration frequency is, for example, equal to or greater than 24 MHz and equal to or less than 80 MHz, a relation of $t=21$ μm is established when the frequency is 80 MHz, and the dimension Z of the quartz crystal substrate 10 in the Z'-axis direction becomes maximum. Therefore, in the resonator element 100, since the relation of $Z/t \leq 34$ is established, it is possible to set Z to be equal to or less than 0.7 mm even when the vibration frequency is 80 MHz. In this manner, in the resonator element 100, it is possible to achieve a further reduction in size. As a result, it is possible to achieve a further reduction in the size of the package that stores the resonator element 100.

In the resonator element 100, when the dimension of the short side of the vibrating portion 14 is set to Mz, the relation of $0.45 \text{ mm}<Mz \leq 0.8 \text{ mm}$ is satisfied. Thereby, it is possible to more reliably achieve a reduction in equivalent series resistance. Specifically, it is possible to set the equivalent series resistance to be equal to or less than $45\Omega$ (see an experimental example of which the detailed description will be given later).

In the resonator element 100, the relation of $0.49 \text{ mm}<Mz<0.8 \text{ mm}$ is satisfied. Therefore, in the resonator element 100, it is possible to achieve a further reduction in equivalent series resistance while achieving a reduction in the size of the vibrating portion 14. Specifically, it is possible to set the equivalent series resistance to be equal to or less than $30\Omega$.

In the resonator element 100, the vibrating portion 14 includes the first convex portion 17 protruding in the +Y' direction further upward than the peripheral portion 12, the lateral side 17d of the first convex portion 17 intersecting the Z'-axis is a side inclined with respect to the plane including the X-axis and the Z'-axis or a side perpendicular thereto, and the relation of $0 \leq Sz/Mz \leq 0.05$ is satisfied when the length of the lateral side 17d along the Z'-axis is set to Sz, when seen in a plan view. Thereby, in the resonator element 100, it is possible to reduce an unnecessary mode such as a contour vibration. Further, in the resonator element 100, the dimension of the lateral side 18c of the second convex portion 18 in the Z'-axis direction is the same Sz as that of the lateral side 17d. Thereby, in the resonator element 100, it is possible to further reduce an unnecessary mode such as a contour vibration.

In the resonator element 100, the relation of 40 μm$\leq(Z-Mz)/2 \leq 400$ μm is satisfied. Therefore, in the resonator element 100, it is possible to reduce the transmission (vibration leakage) of the vibration of the vibrating portion 14 to the peripheral portion 12.

In the resonator element 100, when the dimension of the quartz crystal substrate 10 in the X-axis direction is set to X, a relation of $16 \leq X/t \leq 68$ is satisfied. Thereby, in the resonator element 100, it is possible to achieve a reduction in equivalent series resistance.

In the resonator element 100, it is preferable to satisfy a relation of $20 \leq X/t \leq 54$.

In the resonator element 100, when seen in a plan view, the vibrating portion 14 is provided inside extensions of the excitation electrodes 20a and 20b. Therefore, in the resonator element 100, when seen in a plan view from the Y'-axis direction, it is possible to apply a voltage to a wide portion of the vibrating portion 14.

2. Method of Manufacturing Resonator Element

Next, a method of manufacturing the resonator element according to the present embodiment will be described with reference to the accompanying drawings. FIGS. 7A to 13C are diagrams schematically illustrating a step of manufacturing the resonator element 100 according to the present embodiment. In FIGS. 7A to 13C, part A of each drawing is a plan view, part B is a cross-sectional view taken along line B-B of part A, and part C is a cross-sectional view taken along line C-C of part A.

Figure 7A:
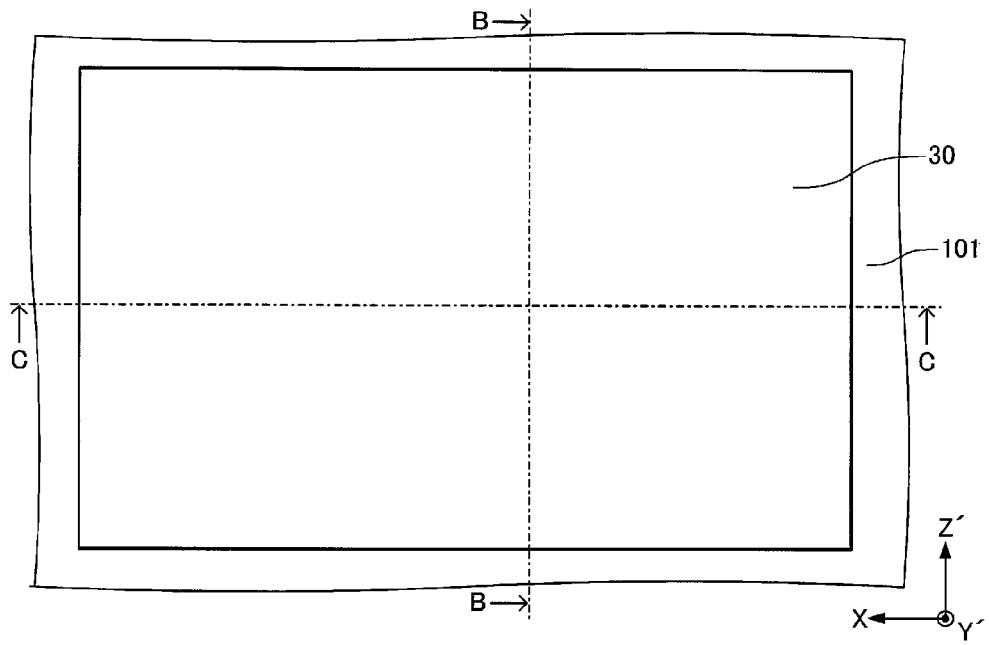
FIGS. 7A to 7C are diagrams schematically illustrating a step of manufacturing the resonator element according to the present embodiment.
Figure 7B:
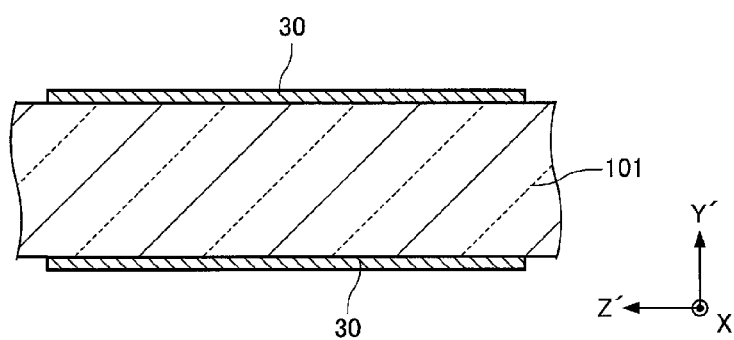
Figure 7C:
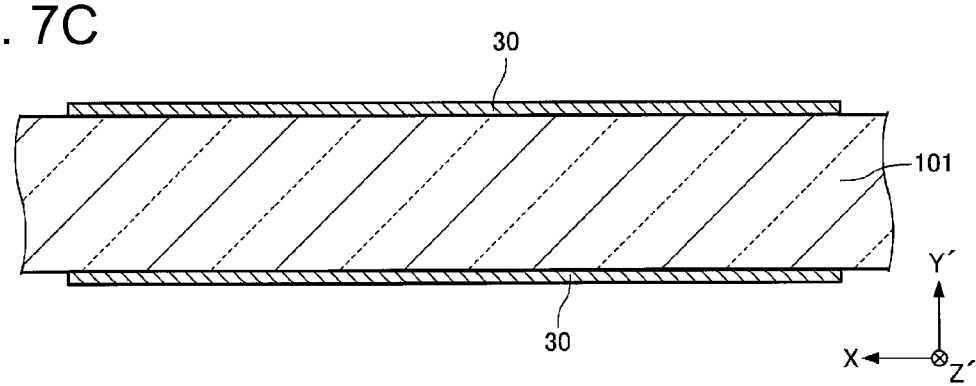

As shown in FIGS. 7A to 7C, corrosion-resistant films 30 are formed on the main front and back surfaces (surfaces including the X-axis and the Z'-axis) of the AT cut quartz crystal vibrating substrate 101. The corrosion-resistant film 30 has chromium and gold laminated in this order by, for example, a sputtering method, a vacuum vapor deposition method or the like, and then is formed by patterning the chromium and gold. The patterning is performed by, for example, a photolithography technique and an etching technique. When the AT cut quartz crystal substrate 101 is processed, the corrosion-resistant film 30 has a corrosion resistance to a solution including hydrofluoric acid serving as an etching solution.

Figure 8A:
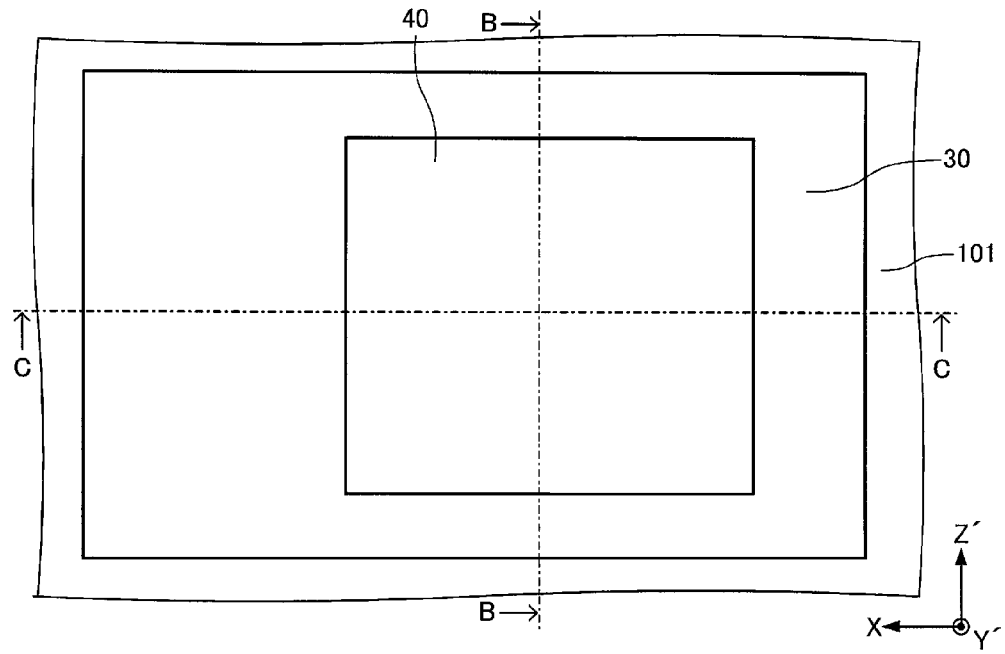
FIGS. 8A to 8C are diagrams schematically illustrating a step of manufacturing the resonator element according to the present embodiment.
Figure 8B:
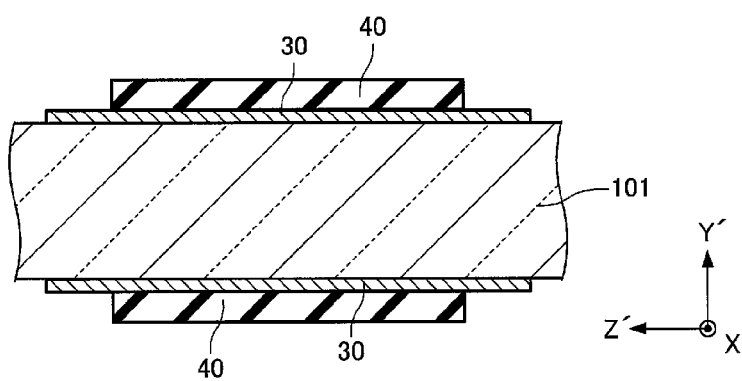
Figure 8C:
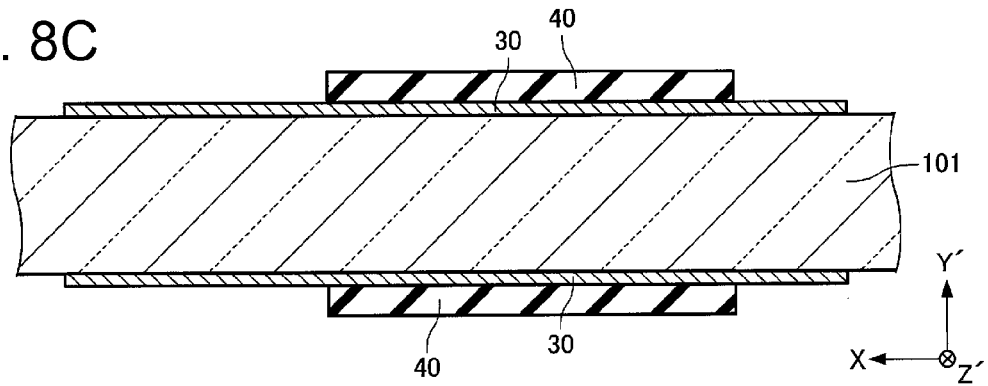

As shown in FIGS. 8A to 8C, after a positive-type photoresist film is applied, the photoresist film is exposed and developed, and a resist film 40 having a predetermined shape is formed. The resist film 40 is formed so as to cover a portion of the corrosion-resistant film 30.

Figure 9A:
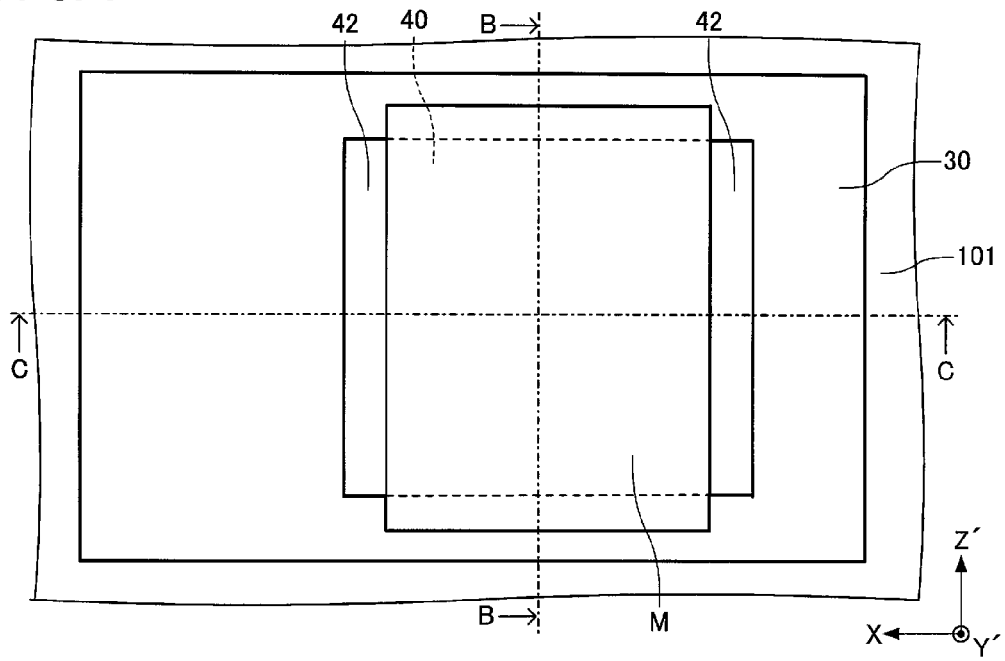
FIGS. 9A to 9C are diagrams schematically illustrating a step of manufacturing the resonator element according to the present embodiment.
Figure 9B:
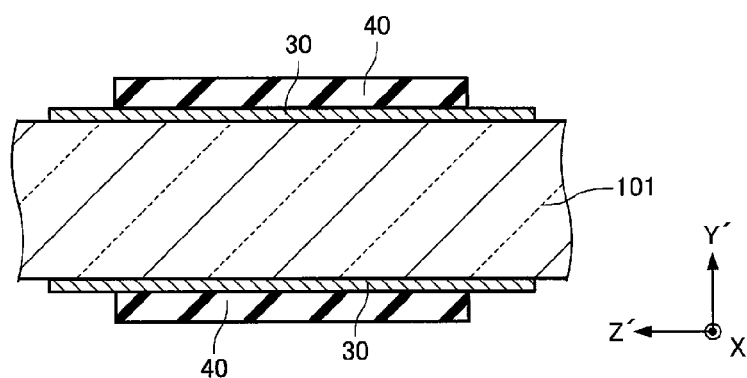
Figure 9C:
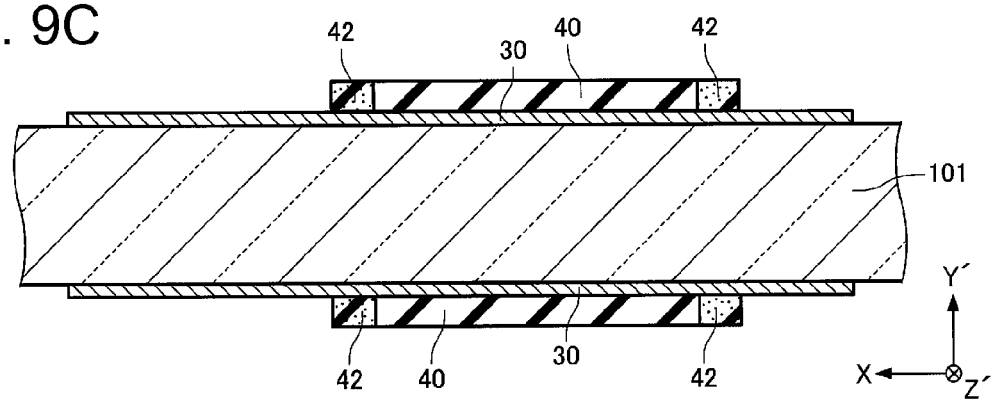

As shown in FIGS. 9A to 9C, a portion of the resist film 40 is exposed again using a mask M, and photosensitive portions 42 are formed. The mask M is disposed so as to intersect the resist film 40, when seen from the Y'-axis direction, as shown in FIG. 9A. That is, the dimension of the mask M in the X-axis direction is smaller than the dimension of the resist film 40 in the X-axis direction, and the dimension of the mask M in the Z'-axis direction is larger than the dimension of the resist film 40 in the Z'-axis direction. Exposure is performed using such a mask M, thereby allowing the photosensitive portions 42 to be formed on both sides of the resist film 40, when seen from the Z'-axis direction, as shown in FIG. 9C.

Figure 10A:
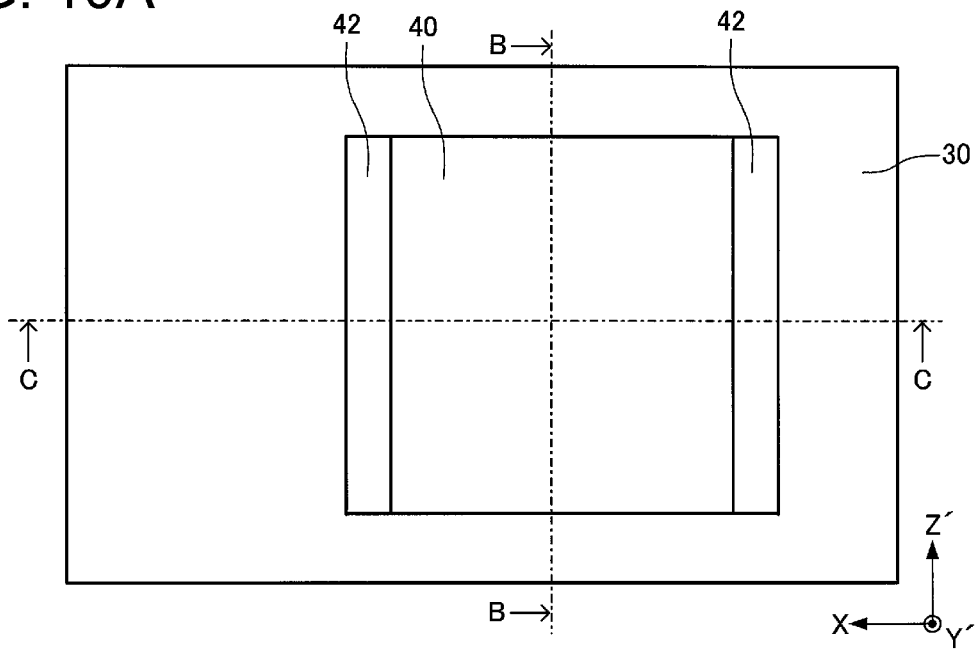
FIGS. 10A to 10C are diagrams schematically illustrating a step of manufacturing the resonator element according to the present embodiment.
Figure 10B:
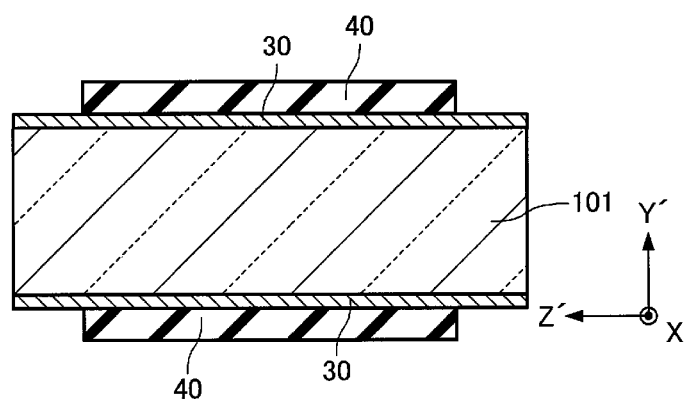
Figure 10C:
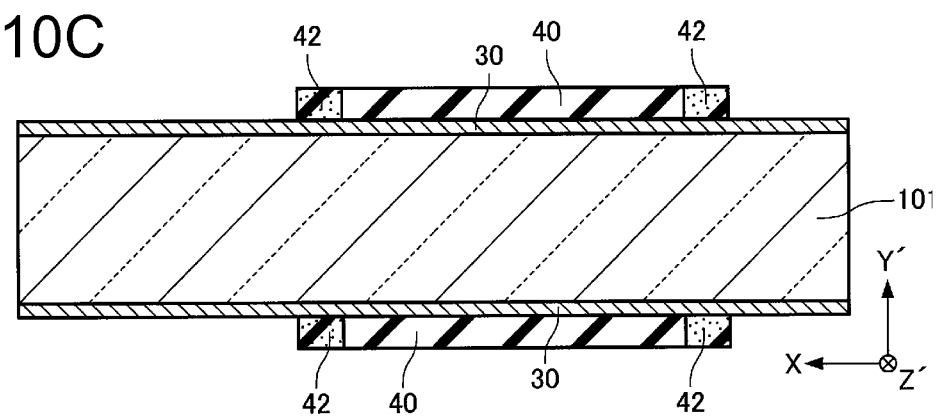

As shown in FIGS. 10A to 10C, the AT cut quartz crystal substrate 101 is etched using the corrosion-resistant film 30 as a mask. The etching is performed using, for example, a mixed liquid of hydrofluoric acid (hydrofluoric acid) and ammonium fluoride as an etching solution. Thereby, the outer shape (shape when seen from the Y'-axis direction) of the quartz crystal substrate 10 is formed.

Figure 11A:
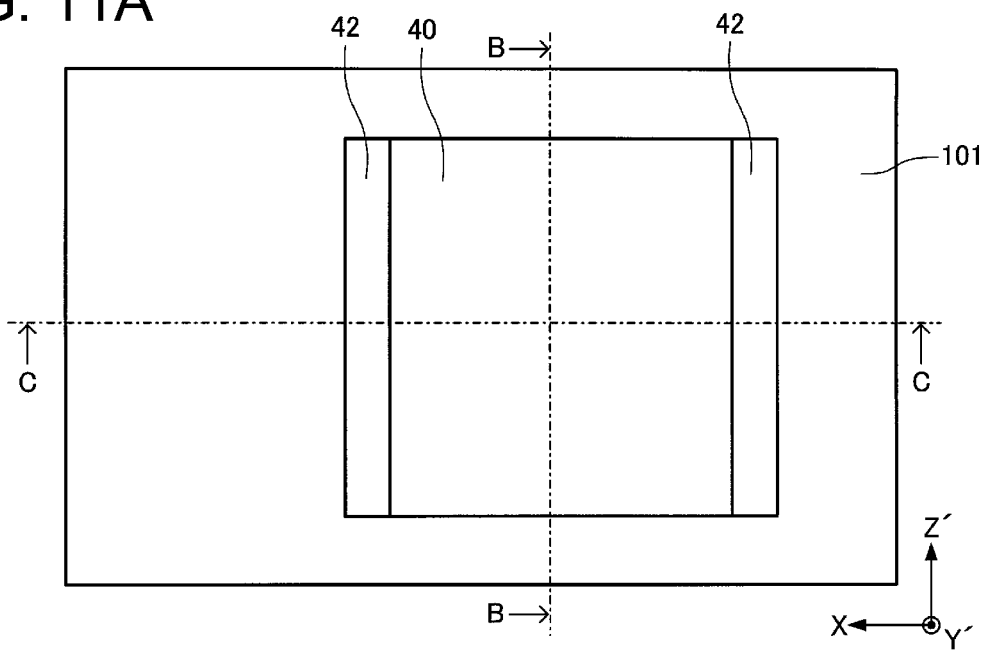
FIGS. 11A to 11C are diagrams schematically illustrating a step of manufacturing the resonator element according to the present embodiment.
Figure 11B:
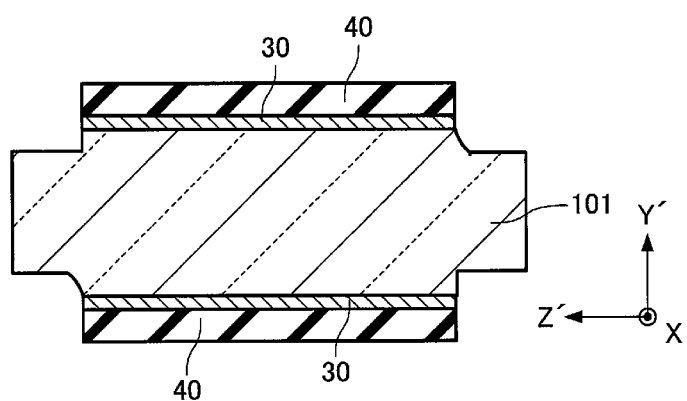
Figure 11C:
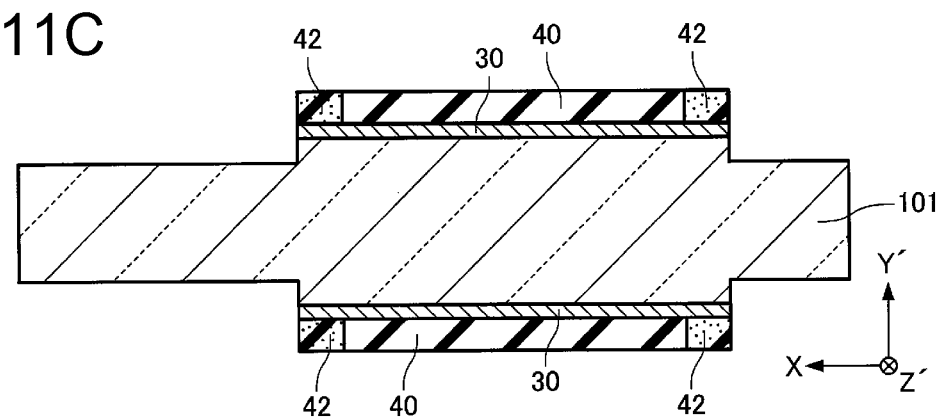

As shown in FIGS. 11A to 11C, after the corrosion-resistant film 30 is etched by a predetermined etching solution, using the resist film 40 as a mask, the AT cut quartz crystal substrate 101 is further half-etched up to a predetermined depth, using the above-mentioned mixed liquid as an etching solution.

Figure 12A:
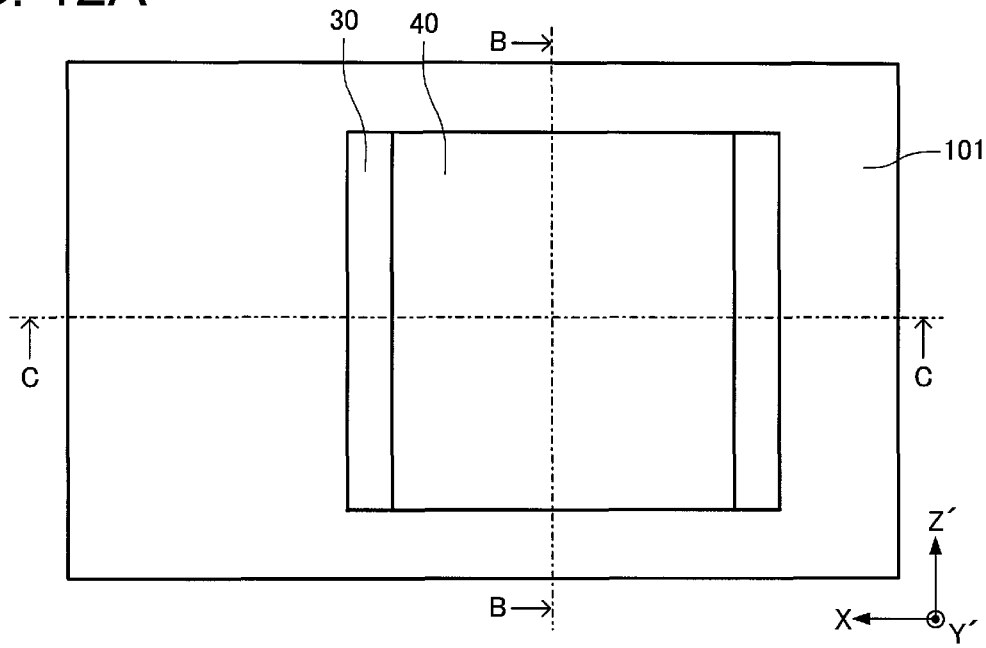
FIGS. 12A to 12C are diagrams schematically illustrating a step of manufacturing the resonator element according to the present embodiment.
Figure 12B:
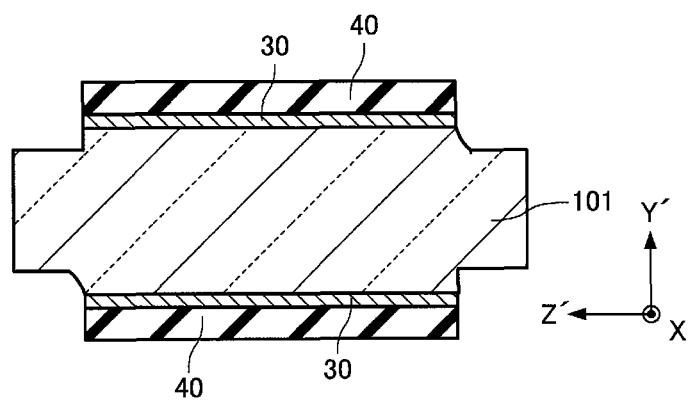
Figure 12C:
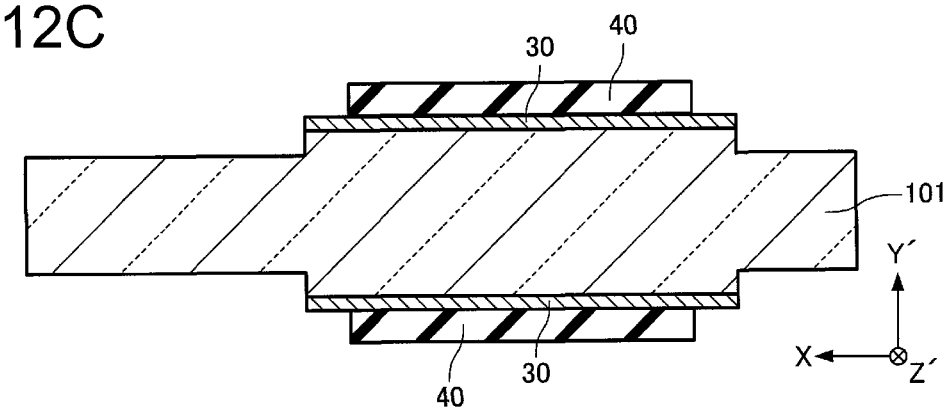

As shown in FIGS. 12A to 12C, the photosensitive portion 42 of the resist film 40 is developed and removed. Thereby, a portion of the corrosion-resistant film 30 is exposed. Before the photosensitive portion 42 is developed, an altered layer (not shown) formed on the surface of the resist film 40 is ashed, for example, using oxygen plasma produced by discharge under a vacuum or reduced-pressure atmosphere. Thereby, it is possible to reliably develop and remove the photosensitive portion 42.

Figure 13A:
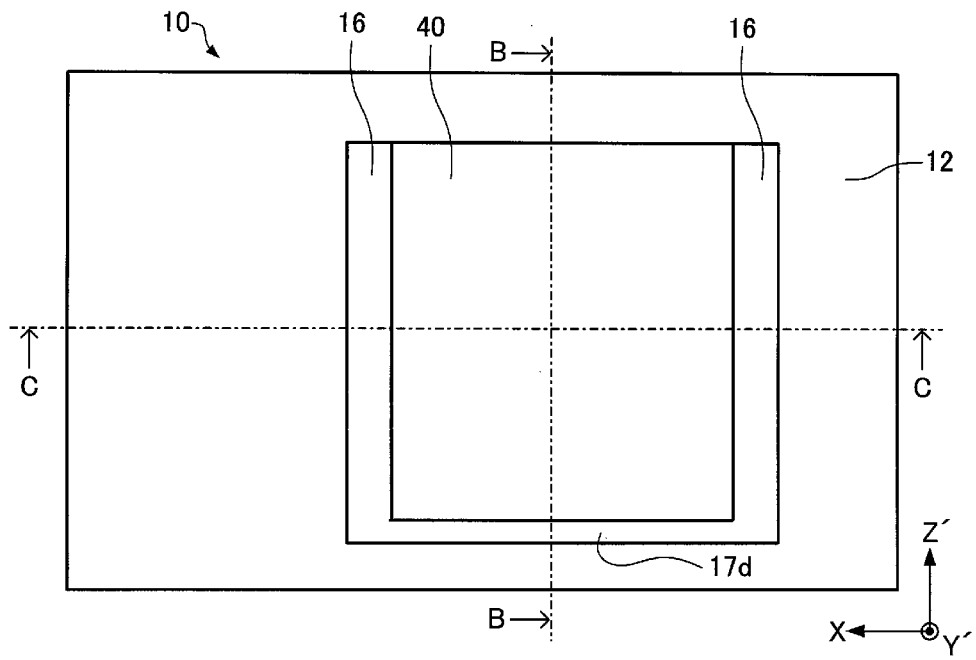
FIGS. 13A to 13C are diagrams schematically illustrating a step of manufacturing the resonator element according to the present embodiment.
Figure 13B:
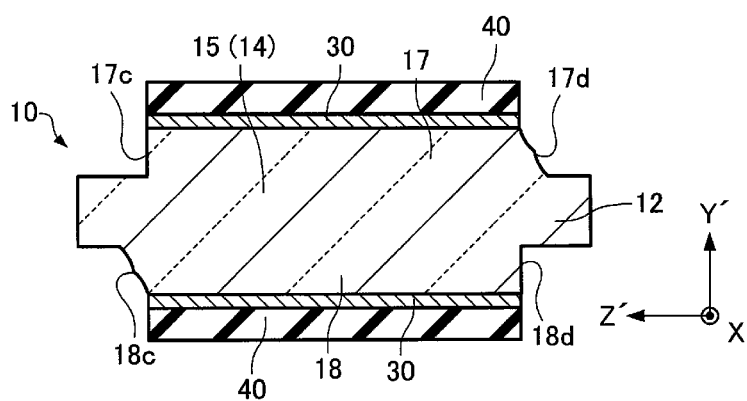
Figure 13C:
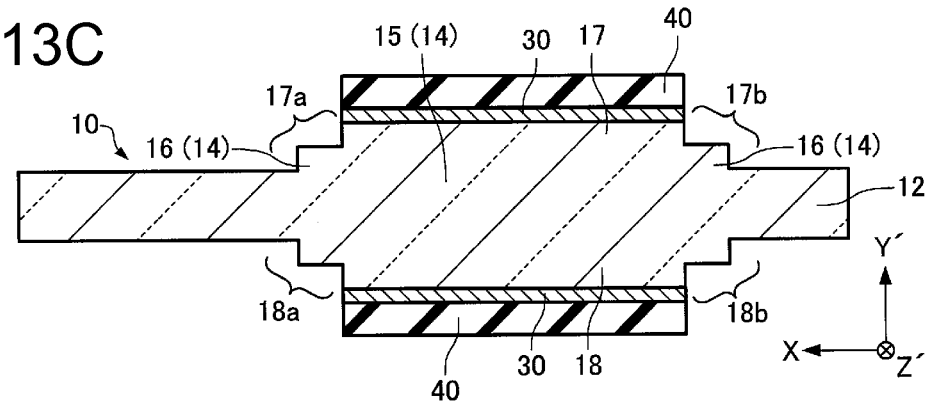

As shown in FIGS. 13A to 13C, after the corrosion-resistant film 30 is etched by a predetermined etching solution, using the resist film 40 as a mask, the AT cut quartz crystal substrate 101 is further half-etched up to a predetermined depth, using the above-mentioned mixed liquid as an etching solution.

It is possible to form the quartz crystal substrate 10 including the peripheral portion 12 and the vibrating portion 14 through the above-mentioned steps.

As shown in FIGS. 2 to 4, after the resist film 40 and the corrosion-resistant film 30 are removed, the excitation electrodes 20a and 20b, the extraction electrodes 22a and 22b, and the pads 24a and 24b are formed in the quartz crystal substrate 10. The excitation electrodes 20a and 20b, the extraction electrodes 22a and 22b, and the pads 24a and 24b have chromium and gold laminated in this order, for example, using a sputtering method, a vacuum vapor deposition method or the like, and then are formed by patterning the chromium and gold.

It is possible to manufacture the resonator element 100 through the above-mentioned steps.

3. Modification Examples of Resonator Element 3.1. First Modification Example

Figure 14:
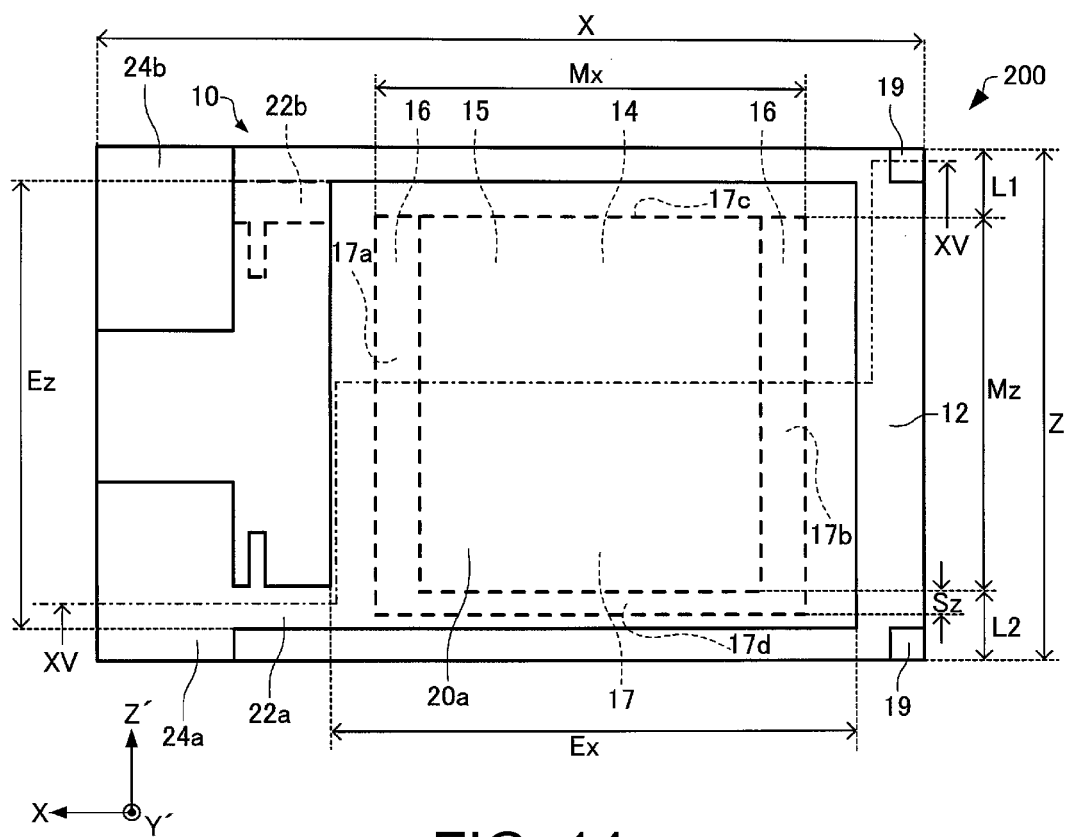
FIG. 14 is a plan view schematically illustrating a resonator element according to a first modification example of the present embodiment.
Figure 15:
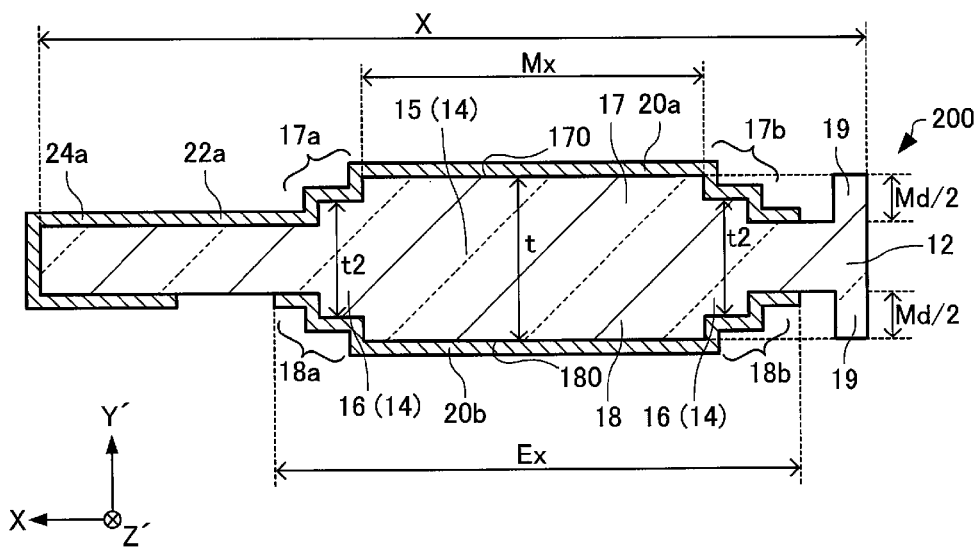
FIG. 15 is a cross-sectional view schematically illustrating the resonator element according to the first modification example of the present embodiment.

Next, a resonator element according to a first modification example of the present embodiment will be described with reference to the accompanying drawings. FIG. 14 is a plan view schematically illustrating a resonator element 200 according to the first modification example of the present embodiment. FIG. 15 is a cross-sectional view taken along line XV-XV of FIG. 14 which schematically illustrates the resonator element 200 according to the first modification example of the present embodiment.

Hereinafter, in the resonator element 200 according to the first modification example of the present embodiment, members having the same functions as those of the configuration members of the above-mentioned resonator element 100 are denoted by the same reference numerals and signs, and thus the detailed description thereof will not be given. The same is true of a resonator element according to a second modification example of the present embodiment, a resonator element according to a third modification example, and a resonator element according to a fourth modification example which will be described below.

As shown in FIGS. 14 and 15, the resonator element 200 is different from the above-mentioned resonator element 100, in that protruding portions 19 are included therein. The material of the protruding portion 19 is the same as, for example, the material of the quartz crystal substrate 10. The protruding portions 19 may be formed integrally with the quartz crystal substrate 10. In the example shown in FIG. 15, the protruding portions 19 protrude in the +Y' direction and the −Y' direction from the peripheral portion 12. The thickness (height) of a portion of the protruding portion 19 which protrudes from the peripheral portion 12 is the same as, for example, the thickness (height) of portions of the convex portions 17 and 18 which protrude from the peripheral portion 12. The protruding portions 19 are provided, for example, at corners on the opposite sides to sides of the peripheral portion 12 on which the pads 24a and 24b are provided. The peripheral portion 12, although not particularly limited, is quadrangular in shape when seen in a plan view, in the example shown in FIG. 14. The protruding portion 19 may be formed in the same step as that in which the vibrating portion 14 is formed.

In addition, the thickness (height) of the portion of the protruding portion 19 which protrudes from the peripheral portion 12 is set to be the same as the thickness of the portions of the convex portions 17 and 18 which protrude from the peripheral portion 12, but may be set to be the same as the thickness (height) of a portion of the second portion 16 which protrudes from the peripheral portion 12, without being limited thereto.

In the resonator element 200, for example, before the vibrating portion 14 collides with a package (package that stores the resonator element 200), the protruding portion 19 collides with the package, and thus it is possible to prevent the vibrating portion 14 from being damaged.

3.2. Second Modification Example

Figure 16:
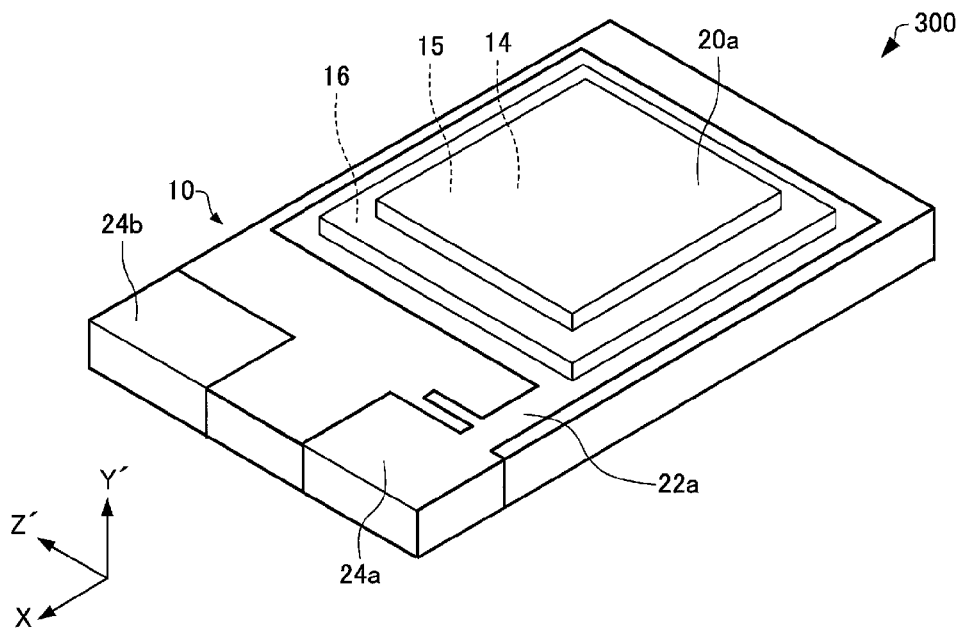
FIG. 16 is a perspective view schematically illustrating a resonator element according to a second modification example of the present embodiment.
Figure 17:
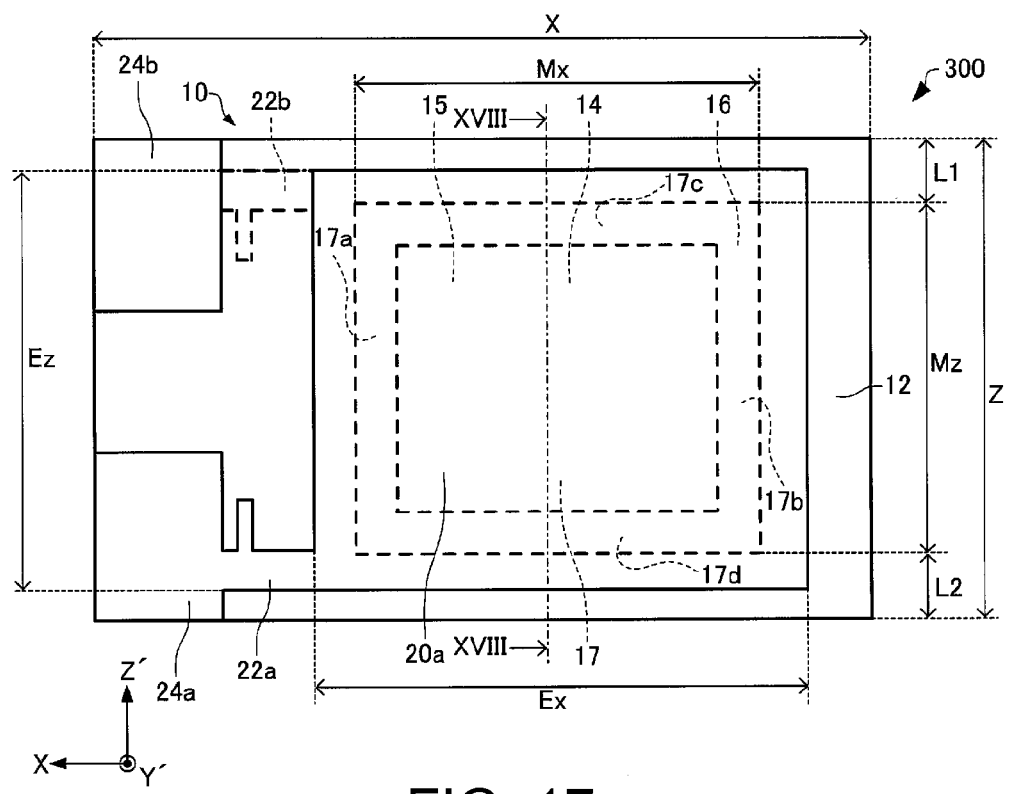
FIG. 17 is a plan view schematically illustrating the resonator element according to the second modification example of the present embodiment.
Figure 18:
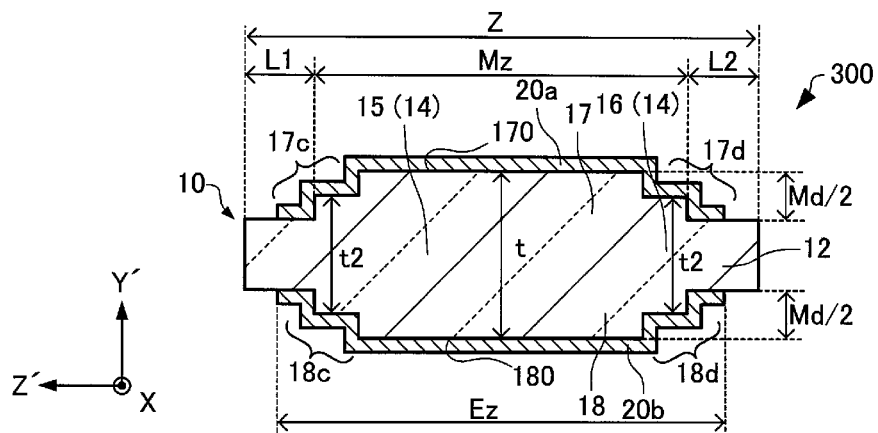
FIG. 18 is a cross-sectional view schematically illustrating the resonator element according to the second modification example of the present embodiment.

Next, a resonator element according to a second modification example of the present embodiment will be described with reference to the accompanying drawings. FIG. 16 is a perspective view schematically illustrating a resonator element 300 according to the second modification example of the present embodiment. FIG. 17 is a plan view schematically illustrating the resonator element 300 according to the second modification example of the present embodiment. FIG. 18 is a cross-sectional view taken along line XVIII-XVIII of FIG. 17 which schematically illustrates the resonator element 300 according to the second modification example of the present embodiment.

In the above-mentioned resonator element 100, as shown in FIGS. 1 to 4, the second portions 16 of the vibrating portion 14 are provided in the +X direction and the −X direction of the first portion 15.

On the other hand, in the resonator element 300, as shown in FIGS. 16 to 18, the second portions 16 of the vibrating portion 14 are also provided in the +Z' direction and the −Z' direction of the first portion 15. Specifically, the second portions 16 are provided in the vicinity of the first portion 15. The lateral sides 17c and 17d of the first convex portion 17 and the lateral sides 18c and 18d of the second convex portion 18 are provided with stepped differences due to a difference between the thickness of the first portion 15 and the thickness of the second portion 16.

The resonator element 300 is manufactured by the mask M (see FIGS. 9A to 9C) described in the method of manufacturing the resonator element 100 being disposed inside the outer edge of the resist film 40, when seen from the Y'-axis direction, to perform exposure. Other than this, a method of manufacturing the resonator element 300 is basically the same as the method of manufacturing the resonator element 100.

Although not shown, in the resonator element 300, the protruding portion 19 may be provided as in the resonator element 200 (see FIGS. 14 and 15).

3.3. Third Modification Example

Figure 19:
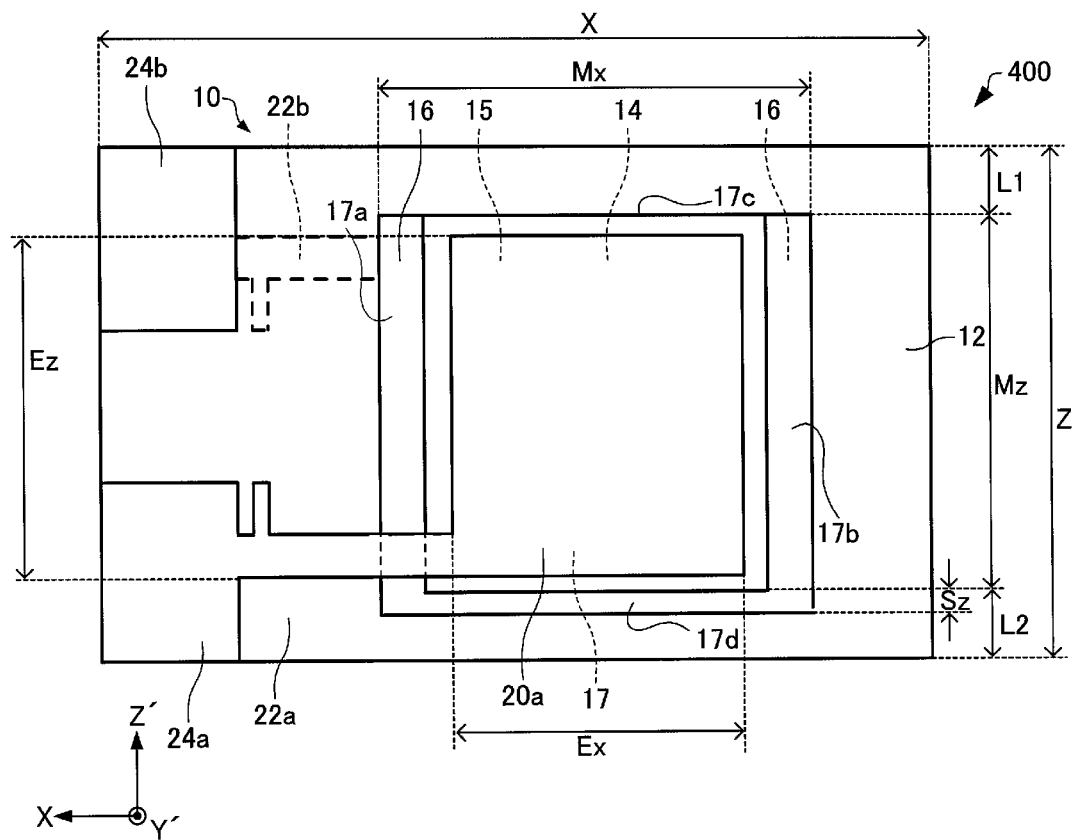
FIG. 19 is a plan view schematically illustrating a resonator element according to a third modification example of the present embodiment.

Next, a resonator element according to a third modification example of the present embodiment will be described with reference to the accompanying drawings. FIG. 19 is a plan view schematically illustrating a resonator element 400 according to the third modification example of the present embodiment.

In the above-mentioned resonator element 100, as shown in FIG. 2, when seen in a plan view from the Y'-axis direction, the vibrating portion 14 is provided inside the outer edges of the excitation electrodes 20a and 20b.

On the other hand, in the resonator element 300, as shown in FIG. 19, when seen in a plan view from the Y'-axis direction, the excitation electrodes 20a and 20b are provided inside the outer edge of the vibrating portion 14. In the shown example, the excitation electrodes 20a and 20b are provided inside the outer edge of the first portion 15 of the vibrating portion 14, when seen in a plan view from the Y'-axis direction.

Although not shown, in the resonator element 400, the protruding portion 19 may be provided as in the resonator element 200 (see FIGS. 14 and 15). In addition, in the resonator element 400, the second portion 16 may be provided in the vicinity of the first portion 15 as in the resonator element 300 (see FIGS. 16 to 18).

3.4. Fourth Modification Example

Figure 20:
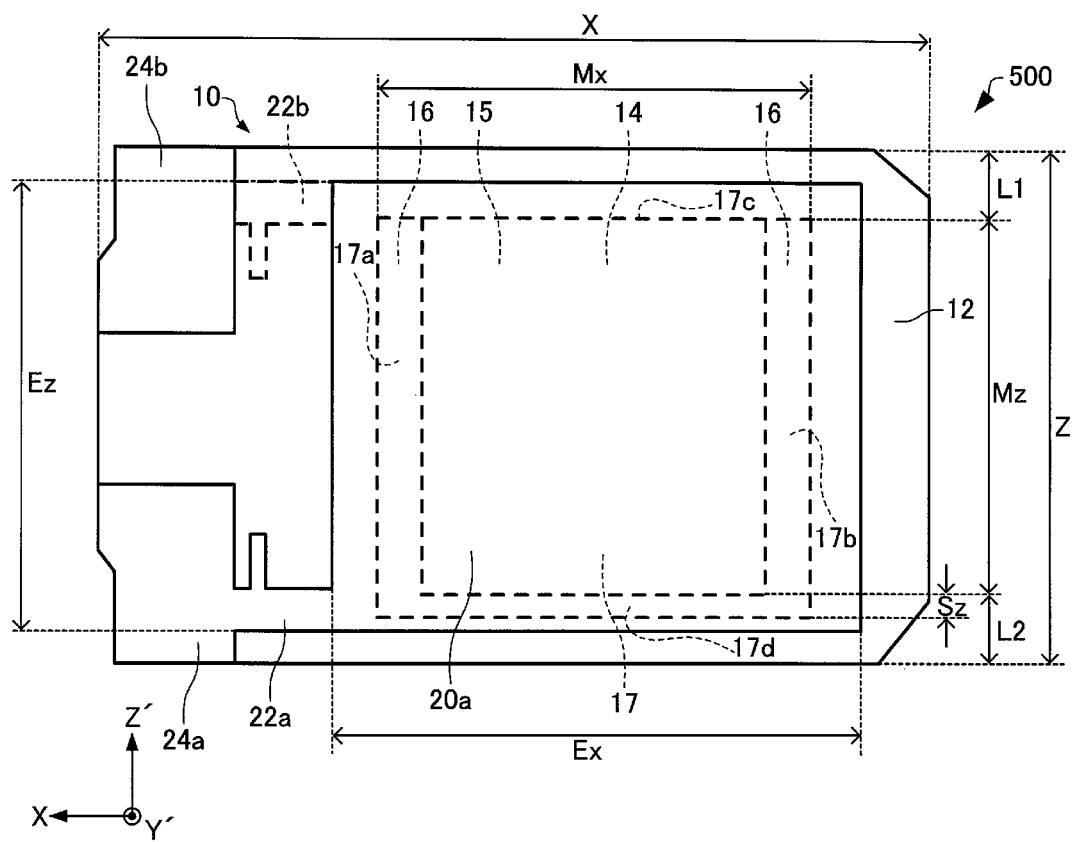
FIG. 20 is a plan view schematically illustrating a resonator element according to a fourth modification example of the present embodiment.

Next, a resonator element according to a fourth modification example of the present embodiment will be described with reference to the accompanying drawings. FIG. 20 is a plan view schematically illustrating a resonator element 500 according to the fourth modification example of the present embodiment.

In the above-mentioned resonator element 100, as shown in FIG. 2, the quartz crystal substrate 10 has a rectangular shape when seen in a plan view from the Y'-axis direction.

On the other hand, in the resonator element 500, the quartz crystal substrate 10 has a shape in which rectangular corners are cut off, as shown in FIG. 20, when seen in a plan view from the Y'-axis direction. In other words, the quartz crystal substrate 10 has a shape in which rectangular corners are chamfered.

In the resonator element 500, the quartz crystal substrate 10 has a shape in which rectangular corners are chamfered. Thereby, when the quartz crystal substrate 10 is formed by etching, it is possible to reduce the generation of a burr (for example, etching residue). Further, when the resonator element 500 is mounted into a package, it is possible to prevent the corners of the quartz crystal substrate 10 from being damaged due to the contact thereof with the package.

Although not shown, in the resonator element 500, the protruding portion 19 may be provided as in the resonator element 200 (see FIGS. 14 and 15). In addition, in the resonator element 500, the second portion 16 may be provided in the vicinity of the first portion 15 as in the resonator element 300 (see FIGS. 16 to 18). In addition, in the resonator element 500, the excitation electrodes 20a and 20b may be provided inside the outer edge of the vibrating portion 14, when seen in a plan view from the Y'-axis direction, as in the resonator element 400 (see FIG. 19).

4. Resonator

Figure 21:
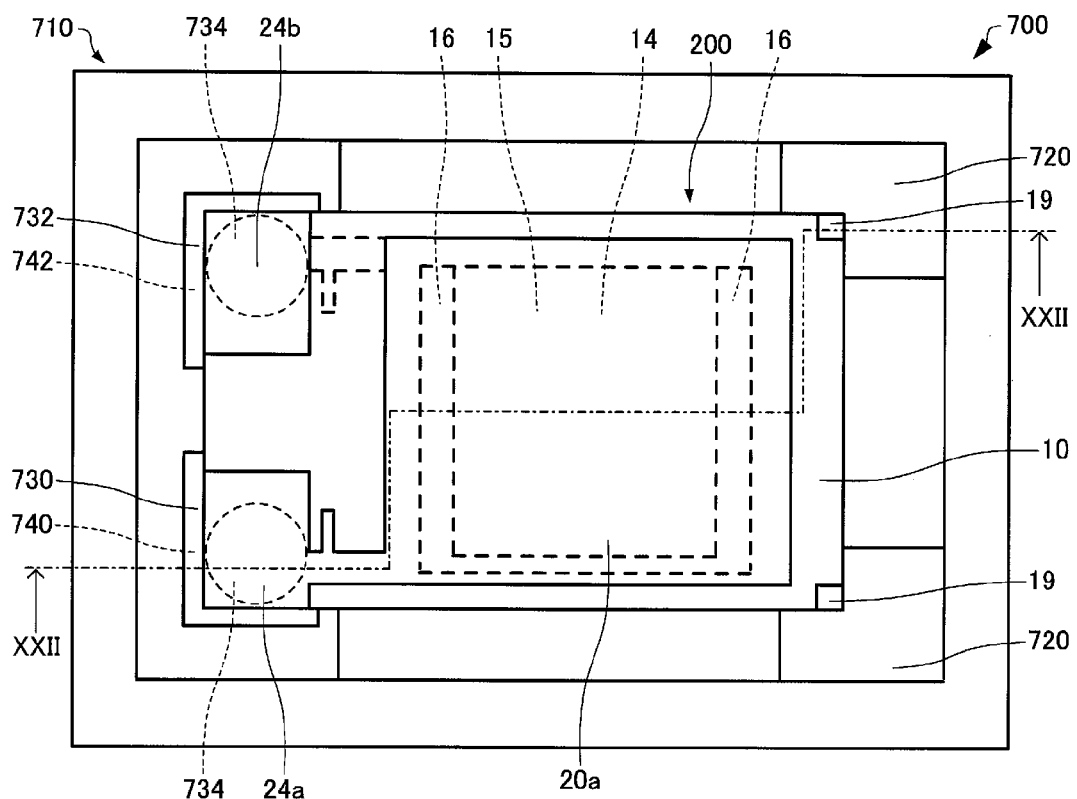
FIG. 21 is a plan view schematically illustrating a resonator according to the present embodiment.
Figure 22:
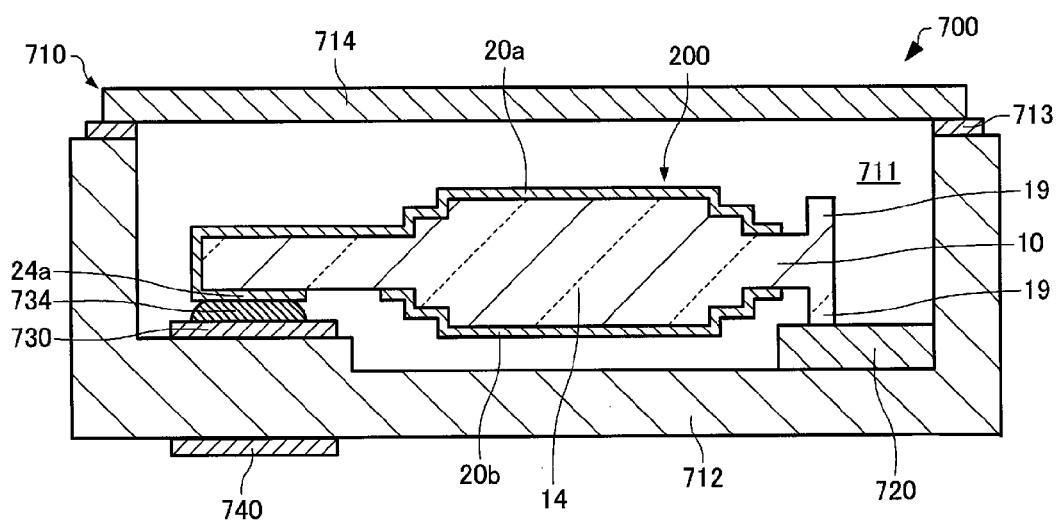
FIG. 22 is a cross-sectional view schematically illustrating the resonator according to the present embodiment.

Next, a resonator according to the present embodiment will be described with reference to the accompanying drawings. FIG. 21 is a plan view schematically illustrating a resonator 700 according to the present embodiment. FIG. 22 is a cross-sectional view taken along line XXII-XXII of FIG. 21 which schematically illustrates the resonator 700 according to the present embodiment. For convenience, in FIG. 21, a seal ring 713 and a lid 714 are omitted.

The resonator 700 includes the resonator element according to the invention. Hereinafter, as the resonator element according to the invention, the resonator 700 including the resonator element 200 will be described. As shown in FIGS. 21 and 22, the resonator 700 includes the resonator element 200 and a package 710.

The package 710 includes a box-shaped base 712 having a concave portion 711 which is open to the upper surface, and a plate-like lid 714 which is bonded to the base 712 so as to block an opening of the concave portion 711. Such a package 710 has a storage space which is formed by the concave portion 711 being blocked by the lid 714, and the resonator element 200 is hermetically stored and installed in the storage space. That is, the resonator element 200 is stored in the package 710.

The inside of the storage space (concave portion 711) in which the resonator element 200 is stored may be set to be in, for example, a decompression (preferably, vacuum) state, and may have inert gas such as nitrogen, helium, or argon sealed therein. Thereby, the vibration characteristics of the resonator element 200 are improved.

The material of the base 712 is, for example, various types of ceramics such as aluminum oxide. The material of the lid 714 is, for example, a material having a linear expansion coefficient approximate to that of the material of the base 712. Specifically, when the material of the base 712 is ceramics, the material of the lid 714 is an alloy such as Kovar.

The bonding of the base 712 to the lid 714 is performed by providing the seal ring 713 on the base 712, placing the lid 714 on the seal ring 713, and welding the seal ring 713 to the base 712 using, for example, a resistance welder. The bonding of the base 712 to the lid 714 is not particularly limited, and may be performed using an adhesive, or may be performed using seam welding.

A pillow portion 720 is provided at the bottom of the concave portion 711 of the package 710. In the shown example, the pillow portion 720 is provided so as to come into contact with the protruding portion 19 of the resonator element 200 (protruding portion 19 protruding to the bottom side of the concave portion 711). The material of the pillow portion 720 is, for example, the same as the material of the base 712. The pillow portion 720 may be provided integrally with the base 712. For example, even when an impact from the outside is applied to the resonator 700, the pillow portion 720 and the protruding portion 19 come into contact with each other, and thus it is possible to prevent the vibrating portion 14 of the resonator element 200 from being damaged due to a collision with the concave portion 711 of the package 710. Further, for example, before the vibrating portion 14 collides with the lid 714, the protruding portion 19 (protruding portion 19 protruding to the lid 714 side) collides with the lid 714, and thus it is possible to reduce the vibrating portion 14 from being damaged.

A first connection terminal 730 and a second connection terminal 732 are provided at the bottom of the concave portion 711 of the package 710. The first connection terminal 730 is provided facing the pad 24a of the resonator element 200. The second connection terminal 732 is provided facing the pad 24b of the resonator element 200. The connection terminals 730 and 732 are electrically connected to the pads 24a and 24b, respectively, through a conductive fixing member 734.

A first external terminal 740 and a second external terminal 742 are provided at the bottom of the package 710 (bottom of the base 712). The first external terminal 740 is provided at a position overlapping the first connection terminal 730, for example, when seen in a plan view (when seen from the Y'-axis direction). The second external terminal 742 is provided at a position overlapping the second connection terminal 732, for example, when seen in a plan view. The first external terminal 740 is electrically connected to the first connection terminal 730 through a via which is not shown. The second external terminal 742 is electrically connected to the second connection terminal 732 through a via which is not shown.

The connection terminals 730 and 732 and the external terminals 740 and 742 are formed using metal coatings obtained by laminating each coating such as Ni (nickel), Au (gold), Ag (silver), or Cu (copper) on a metallization layer (underlying layer) of, for example, Cr (chromium), W (tungsten) or the like. The conductive fixing member 734 is formed using, for example, solder, silver paste, a conductive adhesive (adhesive obtained by dispersing a conductive filler such as metal particles into a resin material), or the like.

In the resonator 700, since the resonator element 200 is included, it is possible to achieve a reduction in equivalent series resistance while achieving a reduction in size.

5. Resonator Device

Figure 23:
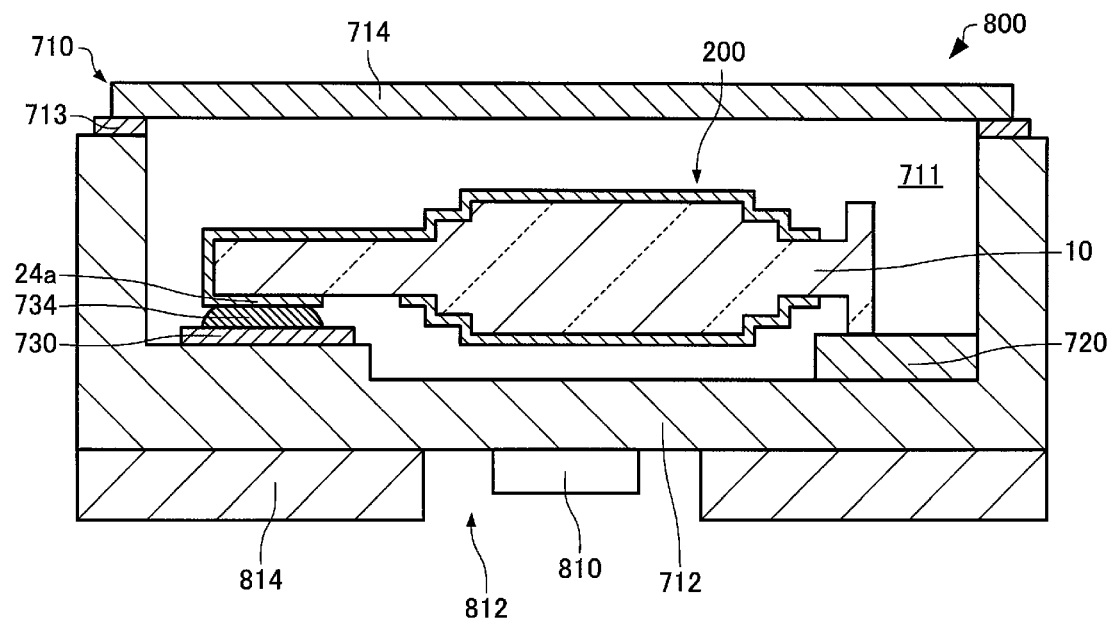
FIG. 23 is a cross-sectional view schematically illustrating a resonator device according to the present embodiment.

Next, a resonator device according to the present embodiment will be described with reference to the accompanying drawings. FIG. 23 is a cross-sectional view schematically illustrating a resonator device 800 according to the present embodiment.

Hereinafter, in the resonator device 800 according to the present embodiment, members having the same functions as those of the configuration members of the above-mentioned resonator 700 are denoted by the same reference numerals and signs, and thus the detailed description thereof will not be given.

The resonator device 800 includes the resonator element according to the invention. Hereinafter, as the resonator element according to the invention, the resonator device 800 including the resonator element 200 will be described. As shown in FIG. 23, the resonator device 800 includes the resonator element 200, the package 710, and a thermo-sensitive element (electronic element) 810.

The package 710 includes a storage portion 812 in which the thermo-sensitive element 810 is stored. The storage portion 812 can be formed, for example, by providing a frame-like member 814 on the bottom side of the base 712.

The thermo-sensitive element 810 is, for example, a thermistor having the physical quantity thereof, for example, the electric resistance changed in accordance with a change in temperature. The electric resistance of the thermistor is detected by an external circuit, and thus the detected temperature of the thermistor can be measured.

Other electronic parts may be stored in the storage space (concave portion 711) of the package 710. Such electronic parts include an IC chip or the like that controls drive of the resonator element 200.

In the resonator device 800, since the resonator element 200 is included, it is possible to achieve a reduction in equivalent series resistance while achieving a reduction in size.

6. Modification Example of Resonator Device 6.1. First Modification Example

Figure 24:
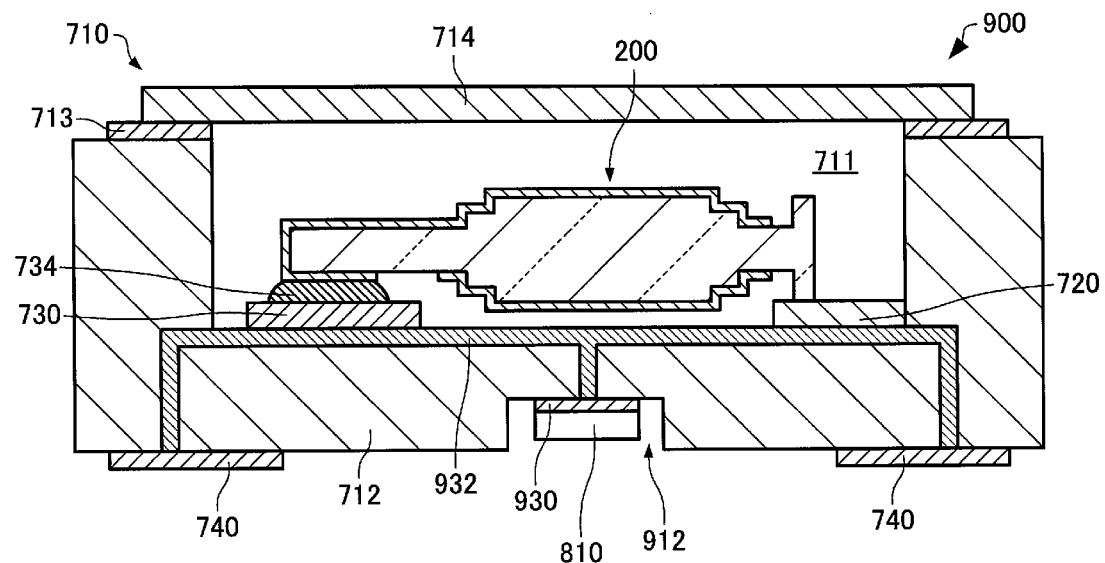
FIG. 24 is a cross-sectional view schematically illustrating a resonator device according to the first modification example of the present embodiment.

Next, a resonator device according to a first modification example of the present embodiment will be described with reference to the accompanying drawing. FIG. 24 is a cross-sectional view schematically illustrating a resonator device 900 according to the first modification example of the present embodiment.

Hereinafter, in the resonator device 900 according to first modification example of the present embodiment, members having the same functions as those of the configuration members of the above-mentioned resonator device 800 are denoted by the same reference numerals and signs, and thus the detailed description thereof will not be given.

In the above-mentioned resonator device 800, as shown in FIG. 23, the frame-like member 814 is provided on the bottom side of the base 712, to thereby form the storage portion 812 in which the thermo-sensitive element 810 is stored.

On the other hand, in the resonator device 900, as shown in FIG. 24, a concave portion 912 is formed at the bottom of the package 710 (at the bottom of the base 712), and the thermo-sensitive element 810 is stored in the concave portion 912. In the shown example, a third connection terminal 930 is provided at the bottom of the concave portion 912, and the thermo-sensitive element 810 is provided below the third connection terminal 930 through a metal bump or the like. In the shown example, the third connection terminal 930 is connected to a wiring 932 which is provided in the base 712, and the third connection terminal 930 is electrically connected to the first external terminal 740 and the first connection terminal 730 by the wiring 932. The material of the third connection terminal 930 is, for example, the same as the material of the connection terminals 730 and 732. The material of the wiring 932 is not particularly limited insofar as it is conductive.

In the resonator device 900, since the resonator element 200 is included, it is possible to achieve a reduction in equivalent series resistance while achieving a reduction in size.

6.2. Second Modification Example

Figure 25:
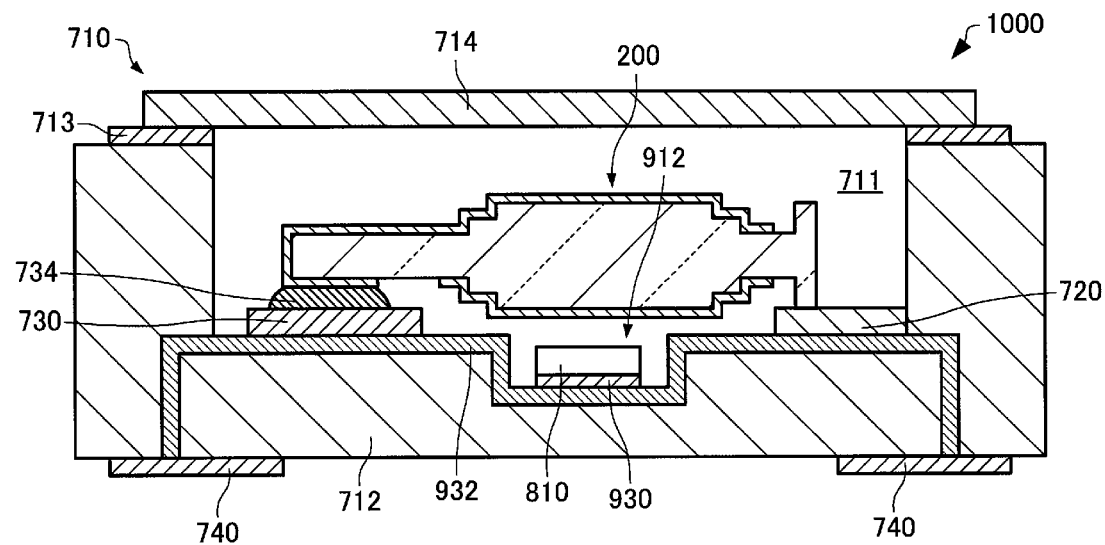
FIG. 25 is a cross-sectional view schematically illustrating a resonator device according to the second modification example of the present embodiment.

Next, a resonator device according to a second modification example of the present embodiment will be described with reference to the accompanying drawings. FIG. 25 is a cross-sectional view schematically illustrating a resonator device 1000 according to the second modification example of the present embodiment.

Hereinafter, in the resonator device 1000 according to the second modification example of the present embodiment, members having the same functions as those of the configuration members of the above-mentioned resonator devices 800 and 900 are denoted by the same reference numerals and signs, and thus the detailed description thereof will not be given.

In the resonator device 800, as shown in FIG. 23, the frame-like member 814 is provided on the bottom side of the base 712, to thereby form the storage portion 812 in which the thermo-sensitive element 810 is stored.

On the other hand, in the resonator device 1000, as shown in FIG. 25, the concave portion 912 is formed at the bottom of the concave portion 711 (upper surface of the base 712), and the thermo-sensitive element 810 is stored in the concave portion 912. The thermo-sensitive element 810 is provided on the third connection terminal 930.

In the resonator device 1000, since the resonator element 200 is included, it is possible to achieve a reduction in equivalent series resistance while achieving a reduction in size.

7. Oscillator

Figure 26:
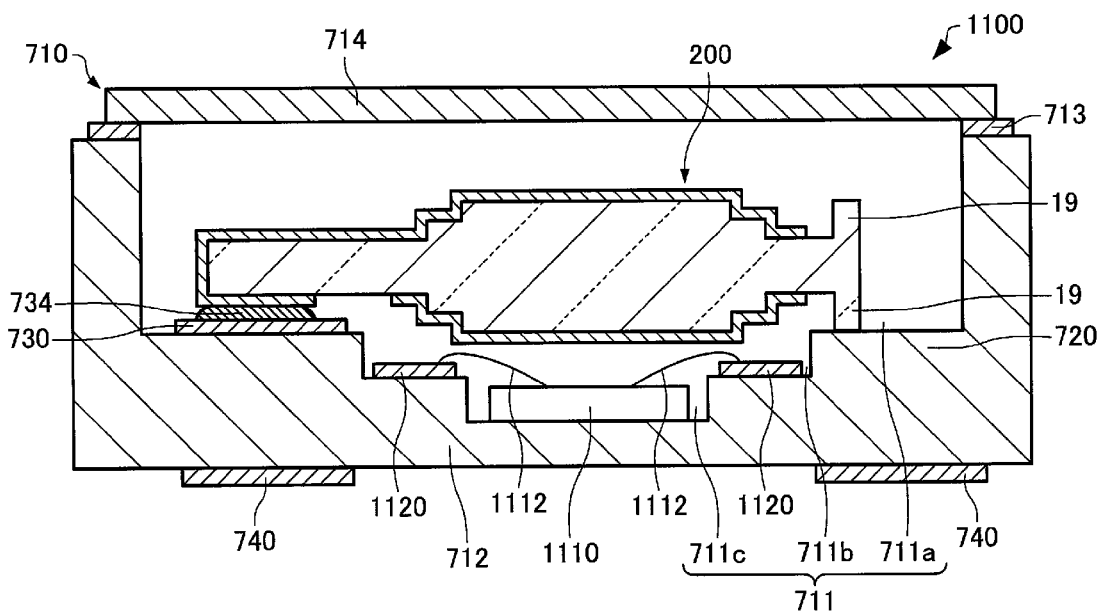
FIG. 26 is a cross-sectional view schematically illustrating an oscillator according to the present embodiment.

Next, an oscillator according to the present embodiment will be described with reference to the accompanying drawings. FIG. 26 is a cross-sectional view schematically illustrating an oscillator 1100 according to the present embodiment.

Hereinafter, in the oscillator 1100 according to the present embodiment, members having the same functions as those of the configuration members of the above-mentioned resonator 700 are denoted by the same reference numerals and signs, and thus the detailed description thereof will not be given.

The oscillator 1100 includes the resonator element according to the invention. Hereinafter, as the resonator element according to the invention, the oscillator 1100 including the resonator element 200 will be described. As shown in FIG. 26, the oscillator 1100 includes the resonator element 200, the package 710, and an IC chip (chip part) 1110.

In the oscillator 1100, the concave portion 711 includes a first concave portion 711a which is provided on the upper surface of the base 712, a second concave portion 711b which is provided at the central portion of the bottom of the first concave portion 711a, and a third concave portion 711c which is provided at the central portion of the bottom of the second concave portion 711b.

The first connection terminal 730 and the second connection terminal 732 are provided at the bottom of the first concave portion 711a. The IC chip 1110 is provided at the bottom of the third concave portion 711c. The IC chip 1110 includes a drive circuit (oscillation circuit) for controlling drive of the resonator element 200. When the resonator element 200 is driven by the IC chip 1110, a vibration having a predetermined frequency can be taken out. The IC chip 1100 overlaps the resonator element 200 when seen in a plan view (when seen from the Y'-axis direction). As shown in FIG. 26, the bottom of the first concave portion 711a may function as the pillow portion 720 which comes into contact with the protruding portion 19 of the resonator element 200.

A plurality of internal terminals 1120 which are electrically connected to the IC chip 1110 through a wire 1112 are provided at the bottom of the second concave portion 711b. For example, one internal terminal 1120 of the plurality of internal terminals 1120 is electrically connected to the first connection terminal 730 through a wiring which is not shown. The other internal terminal 1120 of the plurality of internal terminals 1120 is electrically connected to the second connection terminal 732 through a wiring which is not shown. Therefore, the IC chip 1110 is electrically connected to the resonator element 200. The internal terminals 1120 may be electrically connected to the external terminal 740 through a via (not shown) which is formed in the base 712.

In the resonator device 1100, since the resonator element 200 having a reduction in equivalent series resistance is included, it is possible to achieve a reduction in power consumption.

8. Modification Example of Oscillator

Figure 27:
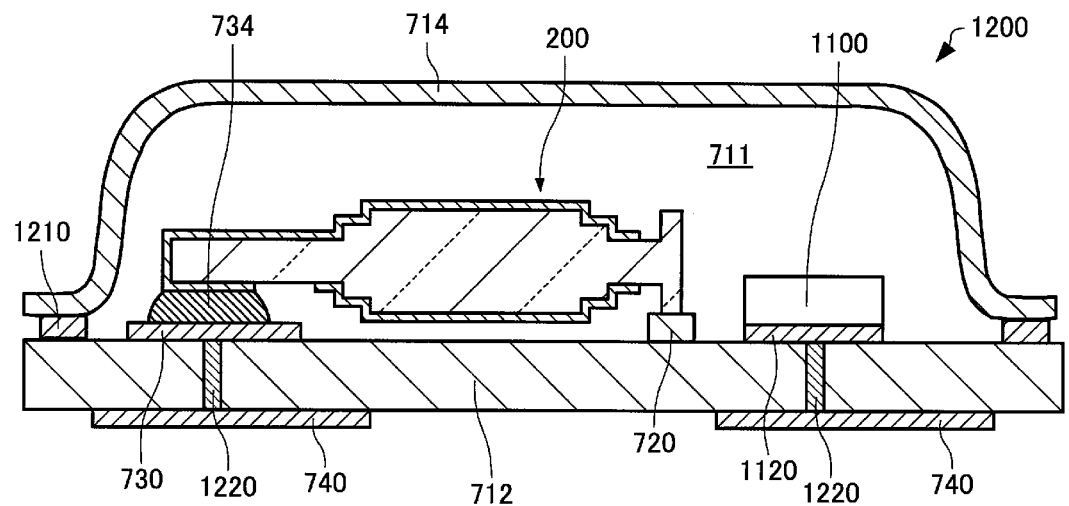
FIG. 27 is a cross-sectional view schematically illustrating an oscillator according to a modification example of the present embodiment.

Next, an oscillator according to a modification example of the present embodiment will be described with reference to the accompanying drawings. FIG. 27 is a cross-sectional view schematically illustrating an oscillator 1200 according to the modification example of the present embodiment.

Hereinafter, in the oscillator 1200 according to modification example of the present embodiment, members having the same functions as those of the configuration members of the above-mentioned oscillator 1100 are denoted by the same reference numerals and signs, and thus the detailed description thereof will not be given.

In the above-mentioned oscillator 1100, as shown in FIG. 26, the IC chip 1100 overlaps the resonator element 200 when seen in a plan view.

On the other hand, in the oscillator 1200, as shown in FIG. 27, the IC chip 1100 does not overlap the resonator element 200 when seen in a plan view. The IC chip 1100 is provided laterally on the resonator element 200.

In the oscillator 1200, the package 710 is constituted by the plate-like base 712 and the convex lid 714. The lid 714 is hermetically sealed by melting a metallization 1210 which is provided in the peripheral portion of the base 712. In this case, the inside thereof can be made to be in a vacuum state by performing a sealing process in a vacuum. As a sealing unit, a unit that melts and welds the lid 714 using laser light or the like may be used.

In the shown example, the first connection terminal 730 is electrically connected to the first external terminal 740 through a via 1220 which is formed in the base 712. In addition, the internal terminals 1120 are electrically connected to the first external terminal 740 through the via 1220 which is formed in the base 712. In addition, the internal terminals 1120 are electrically connected to the first connection terminal 730 through a wiring which is not shown. The IC chip 1100 is provided on the internal terminals 1120 through a metal bump or the like.

In the oscillator 1200, since the resonator element 200 which has a reduction in equivalent series resistance is included, it is possible to achieve a reduction in power consumption.

9. Electronic Device

Next, an electronic device according to the present embodiment will be described with reference to the accompanying drawings. The electronic device according to the present embodiment includes the resonator element according to the invention. Hereinafter, as the resonator element according to the invention, the electronic device including the resonator element 200 will be described.

Figure 28:
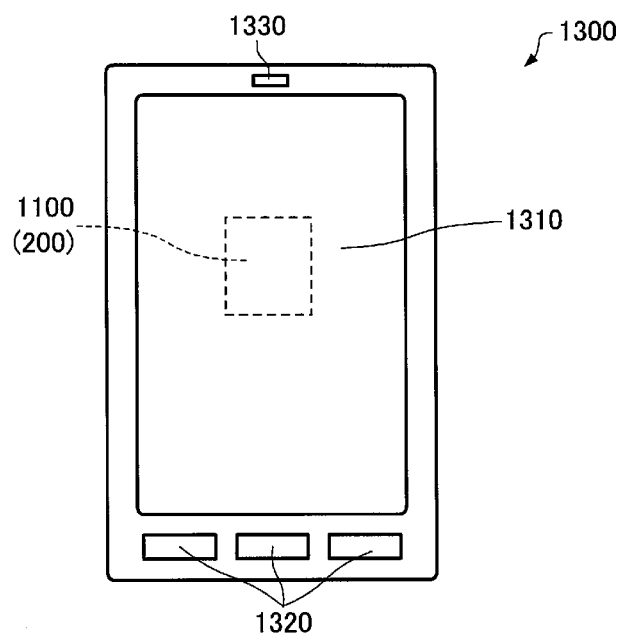
FIG. 28 is a plan view schematically illustrating an electronic device according to the present embodiment.

FIG. 28 is a plan view schematically illustrating a smartphone 1300 as the electronic device according to the present embodiment. As shown in FIG. 28, the smartphone 1300 includes the oscillator 1100 having the resonator element 200.

The smartphone 1300 uses the oscillator 1100 as a timing device such as, for example, a reference clock oscillation source. The smartphone 1300 can further include a display portion (such as a liquid crystal display or an organic EL display) 1310, an operating portion 1320, and a sound output portion 1330 (such as a microphone). The smartphone 1300 may also use the display portion 1310 as the operating portion by providing a contact detection mechanism for the display portion 1310.

The electronic device represented by the smartphone 1300 preferably includes an oscillation circuit that drives the resonator element 200, and a temperature compensation circuit that corrects a frequency fluctuation associated with a change in the temperature of the resonator element 200.

According to this, since the electronic device represented by the smartphone 1300 includes the oscillation circuit that drives the resonator element 200, and the temperature compensation circuit that corrects a frequency fluctuation associated with a change in the temperature of the resonator element 200, it is possible to perform temperature compensation on a resonance frequency which is oscillated by the oscillation circuit, and to provide an electronic device having excellent temperature characteristics.

Figure 29:
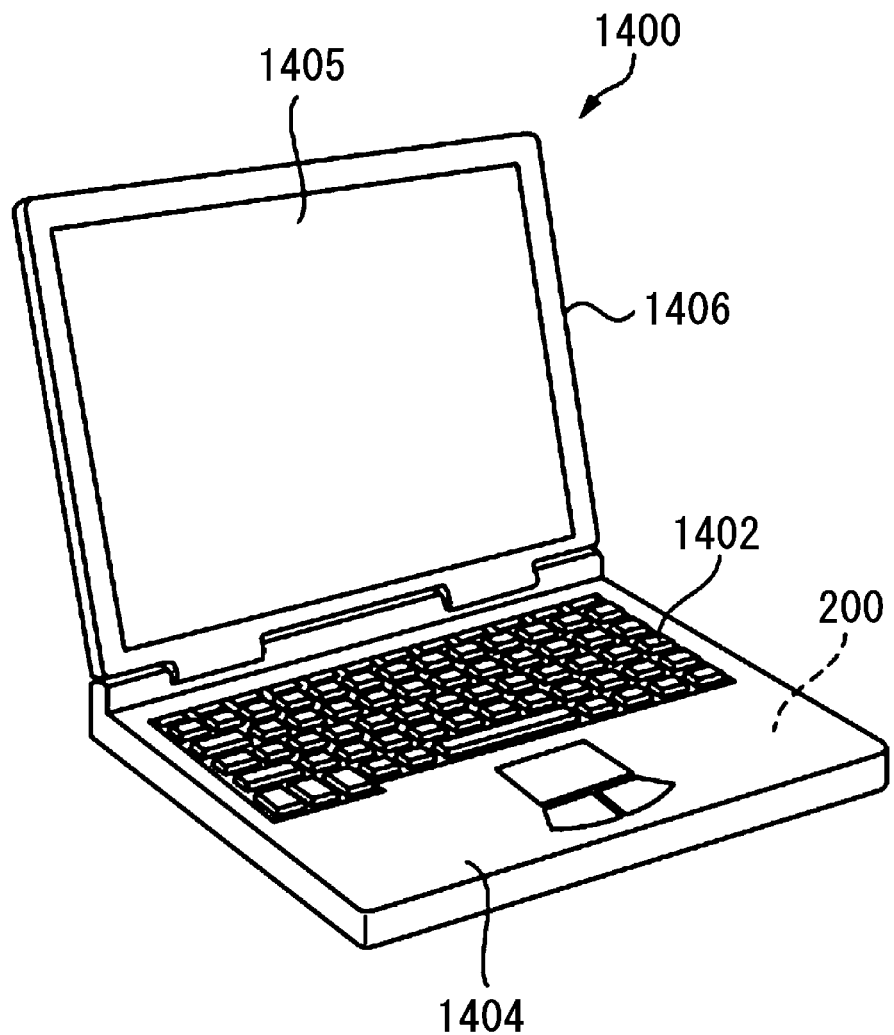
FIG. 29 is a perspective view schematically illustrating an electronic device according to the present embodiment.

FIG. 29 is a perspective view schematically illustrating a mobile-type (or notebook-type) personal computer 1400 as the electronic device according to the present embodiment. As shown in FIG. 29, the personal computer 1400 is constituted by a main body 1404 including a keyboard 1402, and a display unit 1406 including a display portion 1405, and the display unit 1406 is rotatably supported with respect to the main body 1404 through a hinge structure. Such a personal computer 1400 has the resonator element 200 built-in which functions as a filter, a resonator, a reference clock, or the like.

Figure 30:
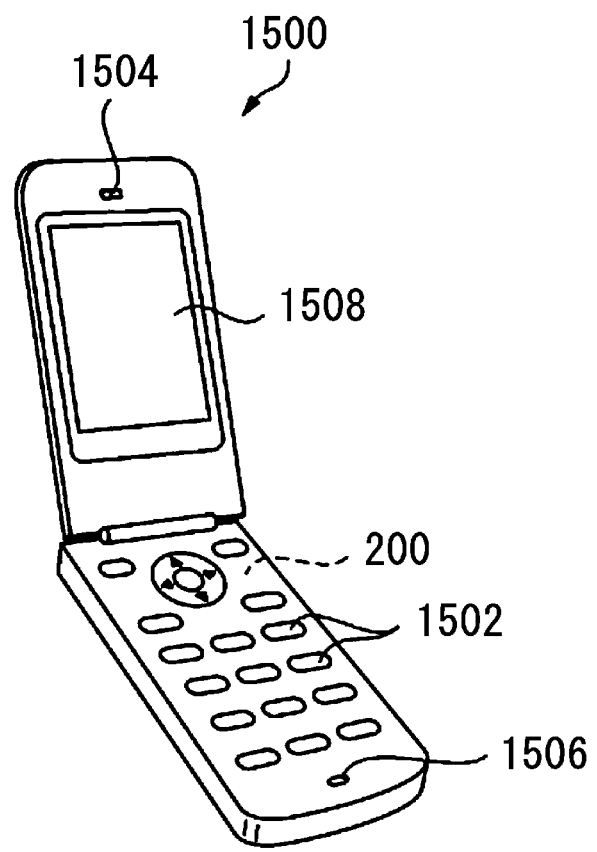
FIG. 30 is a perspective view schematically illustrating an electronic device according to the present embodiment.

FIG. 30 is a perspective view schematically illustrating a cellular phone (also including PHS) 1500 as the electronic device according to the present embodiment. The cellular phone 1500 includes a plurality of operation buttons 1502, an ear piece 1504 and a mouth piece 1506, and has a display portion 1508 disposed between the operation buttons 1502 and the ear piece 1504. Such a cellular phone 1500 has the resonator element 200 built-in which functions as a filter, a resonator, or the like.

Figure 31:
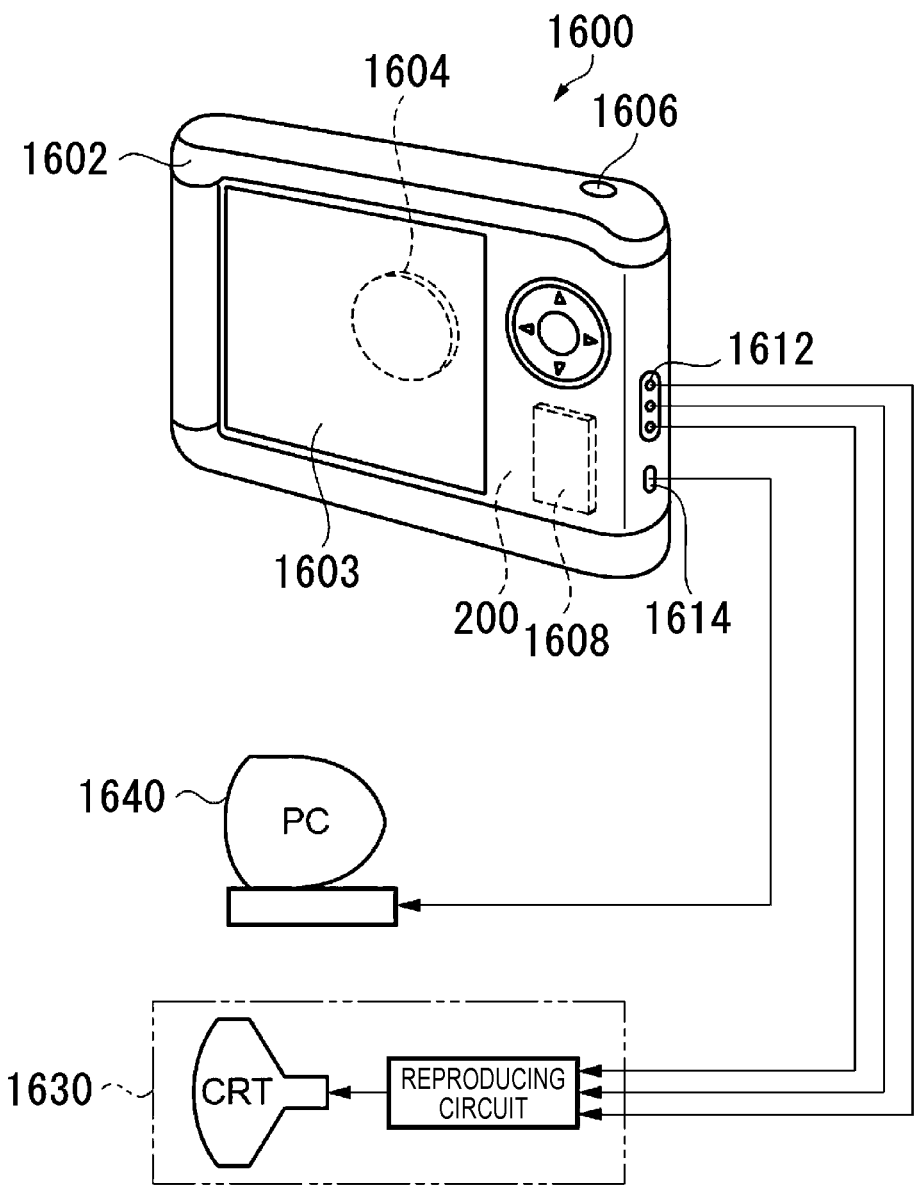
FIG. 31 is a perspective view schematically illustrating an electronic device according to the present embodiment.

FIG. 31 is a perspective view schematically illustrating a digital still camera 1600 as an electronic device according to the present embodiment. In FIG. 31, the connection with an external device is also shown simply. Here, a normal camera exposes a silver halide photo film through a light image of a subject, whereas the digital still camera 1600 generates an imaging signal (image signal) by photoelectrically converting a light image of a subject using an imaging device such as a CCD (Charge Coupled Device).

A display portion 1603 is provided on the rear of a case (body) 1602 in the digital still camera 1600, and is configured to perform a display on the basis of an imaging signal of a CCD. The display portion 1603 functions as a viewfinder for displaying a subject as an electronic image. In addition, a light-receiving unit 1604 including an optical lens (imaging optical system), a CCD and the like is provided on the front side (back side in the drawing) of the case 1602.

When a photographer confirms a subject image displayed on the display portion and pushes a shutter button 1606, an imaging signal of the CCD at that point in time is transmitted and stored to and in a memory 1608. In addition, in the digital still camera 1600, a video signal output terminal 1612 and an input and output terminal 1614 for data communication are provided on the lateral side of the case 1602. As shown in the drawing, a TV monitor 1630 is connected to the video signal output terminal 1612, and a personal computer 1640 is connected to the input and output terminal 1614 for data communication, respectively, as necessary. Further, the imaging signal which is stored in the memory 1608 is output to the TV monitor 1630 or the personal computer 1640 by a predetermined operation. Such a digital still camera 1600 has the resonator element 200 built-in which functions as a filter, a resonator, or the like.

The electronic devices 1300, 1400, 1500, and 1600 according to the present embodiment include the resonator element 200 capable of achieving a reduction in equivalent series resistance, and thus it is possible to reduce power consumption.

The electronic device including the resonator element of the invention is not limited to the above-mentioned examples, and can be applied to, for example, an ink jet ejecting apparatus (for example, ink jet printer), a laptop personal computer, a television, a video camera, a video tape recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instruments (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an airplane, and a ship), a flight simulator, and the like.

10. Mobile Object

Next, a mobile object according to the present embodiment will be described with reference to the accompanying drawings. The mobile object according to the present embodiment includes the resonator element according to the invention. Hereinafter, as the resonator element according to the invention, the mobile object including the resonator element 200 will be described.

Figures 32, 33:
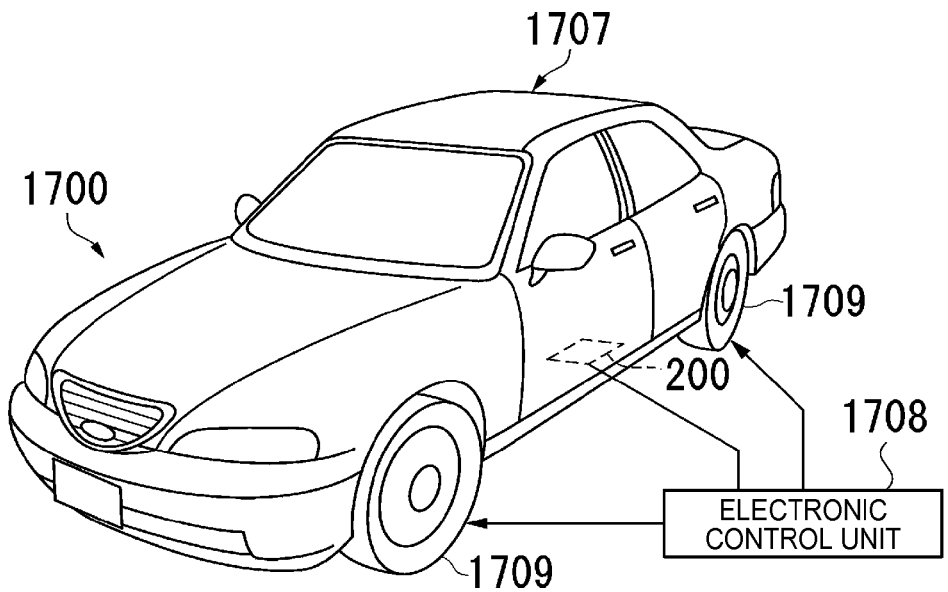
FIG. 32 is a perspective view schematically illustrating a mobile object according to the present embodiment.
FIG. 33 is a table illustrating respective dimensions and CI values of the resonator element.

FIG. 32 is a perspective view schematically illustrating an automobile 1700 as the mobile object according to the present embodiment. For example, as shown in FIG. 32, an electronic control unit 1708 having the resonator element 200 built-in which controls tires 1709 or the like is mounted on a car body 1707 of the automobile 1700. In addition, as other examples, the resonator element 200 can be applied widely to electronic control units (ECUs) such as a keyless entry, an immobilizer, a car navigation system, a car air conditioner, an antilock brake system (ABS), an air bag, a tire pressure monitoring system (TPMS), an engine controller, a battery monitor of a hybrid automobile or an electric automobile, and a car body posture control system.

The mobile object 1700 according to the present embodiment includes the resonator element 200 capable of achieving a reduction in equivalent series resistance, and thus it is possible to reduce power consumption.

11. Experimental Examples

Experimental examples are shown below. The invention is not limited to the following experimental example.

As the experimental examples, a resonator element is manufactured and a CI value is measured. Specifically, an AT cut quartz crystal plate is processed by wet etching using a solution including hydrofluoric acid, and the quartz crystal substrate (piezoelectric substrate) 10 including the peripheral portion 12 and the vibrating portion 14 is formed. The resonator element has a two-step type of mesa structure, and as shown in FIG. 3, the lateral side 17d of the first convex portion 17 and the lateral side 18c of the second convex portion 18 are formed as sides inclined with respect to the plane including the X-axis and the Z'-axis by the m-plane of a quartz crystal being exposed.

FIG. 33 shows a table showing the respective dimensions Mz, X, Z, X/t, Z/t, and Ez (see, for example, FIGS. 2 to 4 described above) of the resonator element, and the CI values which are used in the experimental example. The respective dimensions Mz, X, Z, X/t, Z/t, and Ez are dimensions obtained by, for example, a dimension measuring instrument. The CI value is measured using a network analyzer.

Figure 34:
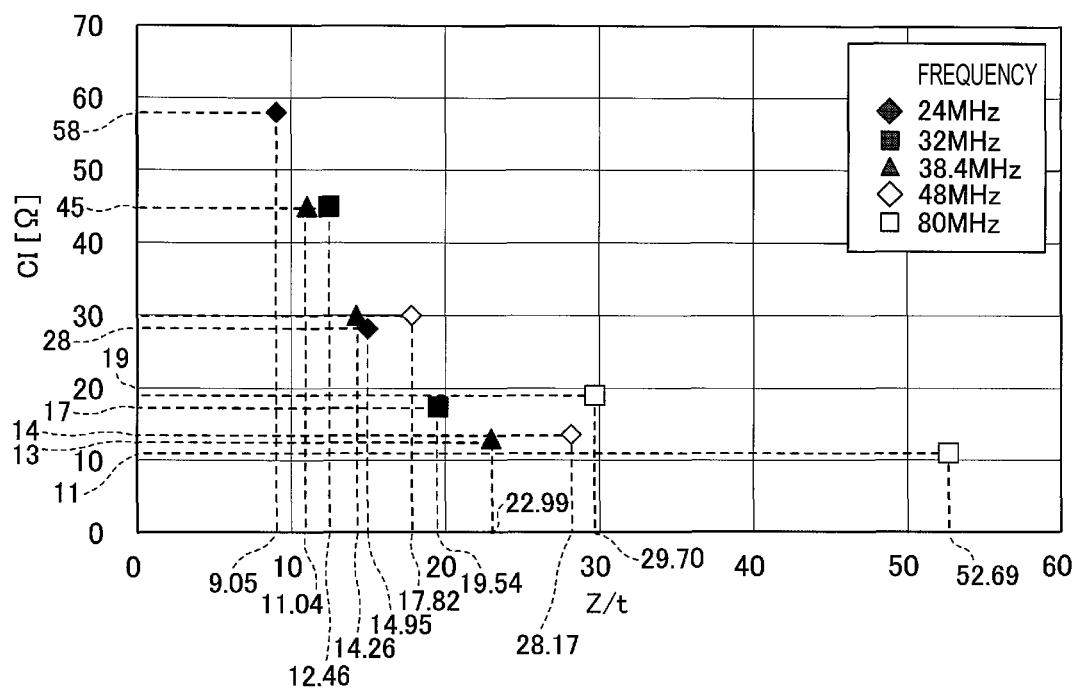
FIG. 34 is a graph illustrating CI values with respect to Z/t.
Figure 35:
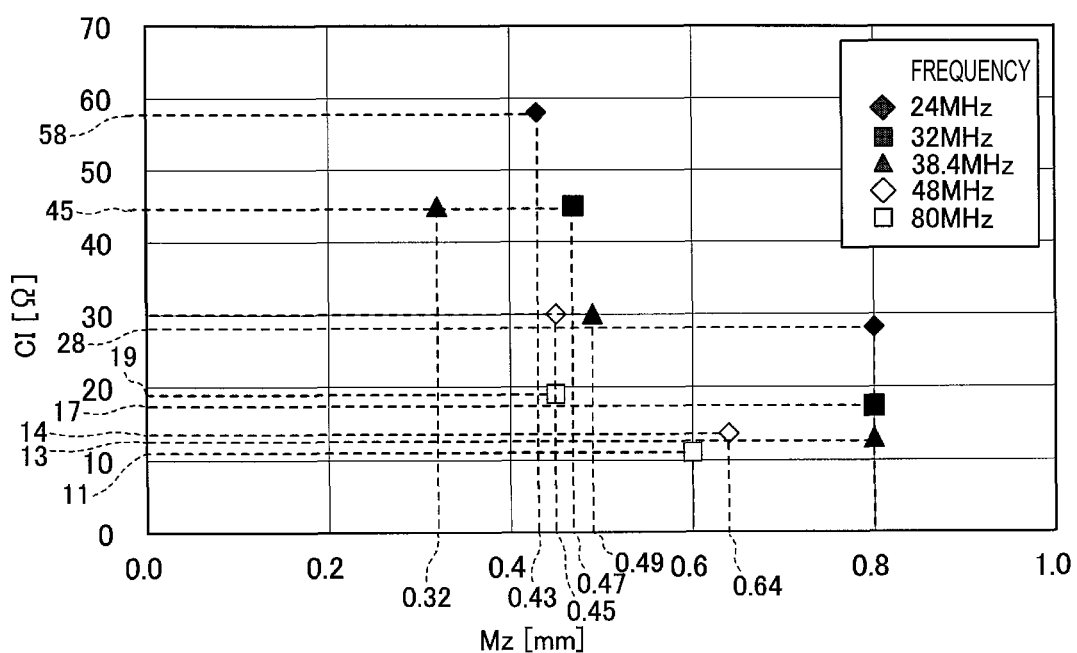
FIG. 35 is a graph illustrating CI values with respect to Mz.

FIG. 34 is a graph illustrating CI values with respect to Z/t. FIG. 35 is a graph illustrating CI values with respect to Mz.

From FIGS. 33 and 34, it can be understood that the CI value is able to be set to be equal to or less than 45Ω in a range of 11<Z/t. On the other hand, the CI value is 58Ω in Z/t=9.05. Further, it can be understood that the CI value is able to be set to be equal to or less than 40Ω in a range of 13≤Z/t.

From FIGS. 33 and 35, it can be understood that the CI value is able to be set to be equal to or less than 45Ω in a range of 0.45 mm<Mz≤0.8 mm. Further, it can be understood that the CI value is able to be set to be equal to or less than 30Ω in a range of 0.49 mm<Mz≤0.8 mm.

The above experimental examples have been performed on the resonator element in which the lateral sides 17d and 18c as shown in FIG. 3 are formed as sides which are inclined with respect to the plane including the X-axis and the Z'-axis. However, the results of the experimental examples can also be applied to a resonator element in which the lateral sides 17d and 18c as shown in FIG. 18 have a stepped difference due to a difference between the thickness of the first portion 15 and the thickness of the second portion 16, and can also be applied to a resonator element in which the lateral sides 17d and 18c as shown in FIG. 6 are formed as sides perpendicular to the plane including the X-axis and the Z'-axis.

In addition, the experimental examples have been performed on, for example, the resonator element having a two-step type of mesa structure as shown in FIGS. 1 to 4. However, the results of the experiments can also be applied to, for example, a piezoelectric resonator element having a multistage-type mesa structure of three or more step type.

In addition, the results of the experimental examples can also be applied to the resonator element (see, for example, FIGS. 1 to 4) in which the vibrating portion 14 is provided inside the outer edges of the excitation electrodes 20a and 20b when seen in a plan view (when seen from the Y'-axis direction), and can also be applied to the resonator element (see FIG. 20) in which the excitation electrodes 20a and 20b are provided inside the outer edge of the vibrating portion 14.

The above-mentioned embodiments and modification examples are illustrative examples, and are not limited thereto. For example, each of the embodiments and each of the modification examples can also be appropriately combined.

The invention includes substantially the same configurations (for example, configurations having the same functions, methods and results, or configurations having the same objects and effects) as the configurations described in the embodiments. In addition, the invention includes a configuration obtained by replacing non-essential portions in the configurations described in the embodiments. In addition, the invention includes a configuration that exhibits the same operational effects as those of the configurations described in the embodiment or a configuration capable of achieving the same objects. In addition, the invention includes a configuration obtained by adding the configurations described in the embodiments to known techniques.

The entire disclosure of Japanese Patent Application No. 2014-157159 filed Jul. 31, 2014 is expressly incorporated by reference herein.

What is claimed is:

1. A resonator element comprising:
  a quartz crystal substrate having:
    an X-axis as an axis of rotation, the X-axis being of an orthogonal coordinate system constituted by the X-axis as an electrical axis, a Y-axis as a mechanical axis, and a Z-axis as an optical axis which are crystal axes of a quartz crystal,
    a Z' axis obtained by inclining the Z-axis so that a +Z side rotates in a −Y direction of the Y-axis,
    a Y' axis obtained by inclining the Y-axis so that a +Y side rotates in a +Z direction of the Z-axis,
    a main surface along a plane including the X-axis and the Z'-axis, and
    a thickness in a direction along the Y'-axis,
  wherein the quartz crystal substrate includes:
    a vibrating portion including a side along the X-axis and a side along the Z'-axis, and
    a peripheral portion provided along an outer edge of the vibrating portion, the peripheral portion having a thickness that is smaller than that of the vibrating portion,
  wherein the vibrating portion includes:
    a first portion,
    a second portion provided on at least an outer edge on a +X side of the X-axis and an outer edge on a −X side of the X-axis, among outer edges of the first portion, the second portion having a thickness that is smaller than that of the first portion, and
    a convex portion protruding in a +Y' direction of the Y'-axis further than the peripheral portion,
  wherein Z is a length of the quartz crystal substrate along the Z'-axis, t is a thickness of the first portion, and 11<Z/t≤53,
  wherein the convex portion includes one lateral side including a surface which intersects the Z'-axis and is inclined with respect to a plane including the X-axis and the Z'-axis, the other lateral side including a surface which intersects the Z'-axis and is perpendicular to the plane including the X-axis and the Z'-axis, and a planar portion which is interposed between the one lateral side and the other lateral side, and wherein when seen in a plan view, Sz is a length of the one lateral side along the Z'-axis, Mz is a length of the planar portion along the Z'-axis, and $0 \leq Sz/Mz \leq 0.05$.

2. The resonator element according to claim 1, wherein $13 \leq Z/t \leq 34$.

3. The resonator element according to claim 2, wherein 0.45 mm<Mz≤0.8 mm.

4. The resonator element according to claim 1, wherein 0.45 mm<Mz≤0.8 mm.

5. The resonator element according to claim 4, wherein 0.49 mm<Mz<0.8 mm.

6. The resonator element according to claim 1, wherein a first main surface and a second main surface of the quartz crystal substrate which have a front-back relationship with each other include excitation electrodes which are provided so as to overlap each other when seen in a plan view, and
wherein when seen in the plan view, the vibrating portion is provided inside outer edges of the excitation electrodes.

7. A resonator comprising:
a resonator element according to claim 1; and
a package in which the resonator element is stored.

8. A resonator device comprising:
a resonator element according to claim 1; and
an electronic element.

9. A resonator device according to claim 8, wherein the electronic element is a thermo-sensitive element.

10. An oscillator comprising the resonator element according to claim 1; and
an oscillation circuit which is electrically connected to the resonator element.

11. An electronic device comprising the resonator element according to claim 1.

12. A mobile object comprising the resonator element according to claim 1.

13. A resonator element comprising:
a quartz crystal substrate having:
an X-axis as an axis of rotation, the X-axis being of an orthogonal coordinate system constituted by the X-axis as an electrical axis, a Y-axis as a mechanical axis, and a Z-axis as an optical axis which are crystal axes of a quartz crystal,
a Z' axis obtained by inclining the Z-axis so that a +Z side rotates in a −Y direction of the Y-axis,
a Y' axis obtained by inclining the Y-axis so that a +Y side rotates in a +Z direction of the Z-axis,
a main surface along a plane including the X-axis and the Z'-axis, and
a thickness in a direction along the Y'-axis,
wherein the quartz crystal substrate includes:
a vibrating portion including a side along the X-axis and a side along the Z'-axis, and
a peripheral portion provided along an outer edge of the vibrating portion, the peripheral portion having a thickness that is smaller than that of the vibrating portion,
wherein the vibrating portion includes:
a first portion,
a second portion provided on at least an outer edge on a +X side of the X-axis and an outer edge on a −X side of the X-axis, among outer edges of the first portion, the second portion having a thickness that is smaller than that of the first portion, and
a convex portion protruding in a +Y' direction of the Y'-axis further than the peripheral portion,
wherein Z is a length of the quartz crystal substrate along the Z'-axis, t is a thickness of the first portion, and $11 < Z/t \leq 53$,
wherein the convex portion includes one lateral side including a surface which intersects the Z'-axis and is inclined with respect to a plane including the X-axis and the Z'-axis, the other lateral side including a surface which intersects the Z'-axis and is perpendicular to the plane including the X-axis and the Z'-axis, and a planar portion which is interposed between the one lateral side and the other lateral side, and
wherein Mz is a length of the flat portion along the Z'-axis, and 40 µm≤(Z−Mz)/2≤400 µm.

14. The resonator element according to claim 13, wherein $13 \leq Z/t \leq 34$.

15. The resonator element according to claim 13, wherein 0.45 mm<Mz≤0.8 mm.

16. The resonator element according to claim 15, wherein 0.49 mm<Mz<0.8 mm.

* * * * *